(12) United States Patent
Miida

(10) Patent No.: US 6,538,925 B2
(45) Date of Patent: Mar. 25, 2003

(54) SEMICONDUCTOR MEMORY DEVICE, METHOD OF MANUFACTURING THE SAME AND METHOD OF DRIVING THE SAME

(75) Inventor: Takashi Miida, Kanagawa (JP)

(73) Assignee: Innotech Corporation (JP)

(*) Notice: Subject to any disclaimer, the term of this patent is extended or adjusted under 35 U.S.C. 154(b) by 0 days.

(21) Appl. No.: 09/984,190

(22) Filed: Oct. 29, 2001

(65) Prior Publication Data

US 2002/0054512 A1 May 9, 2002

(30) Foreign Application Priority Data

| Nov. 9, 2000 | (JP) | 2000-342616 |
|---|---|---|
| Apr. 12, 2001 | (JP) | 2001-114291 |
| Apr. 20, 2001 | (JP) | 2001-123213 |
| May 14, 2001 | (JP) | 2001-143920 |

(51) Int. Cl.$^7$ .............................................. G11C 11/34
(52) U.S. Cl. ........................... 365/185.28; 365/185.05
(58) Field of Search ..................... 365/185.28, 185.05

(56) References Cited

U.S. PATENT DOCUMENTS

| 5,792,695 A | * 8/1998 | Ono et al. ................. 438/257 |
|---|---|---|
| 5,949,711 A | 9/1999 | Kazerounian ........... 365/185.05 |
| 6,011,725 A | 1/2000 | Eitan ...................... 365/185.33 |

* cited by examiner

Primary Examiner—M. Tran
(74) Attorney, Agent, or Firm—Lorusso & Loud

(57) ABSTRACT

The present invention relates to a dual bit nonvolatile programmable read/write memory containing a semiconductor memory element having one conductivity type semiconductor substrate including at least one convex portion. A pair of opposite conductivity source/drain regions are formed on a surface of the semiconductor substrate an opposing sides of the convex portion, and a first insulating film covers the upper surface of the convex portion. Second insulating films cover the side surfaces of the convex portion and the source/drain regions. A pair of floating gates abut opposing side surfaces of the convex portion and the source/drain regions through the second insulating films. Third insulating films are formed on the floating gates. A control gate covers the upper surface of the convex portion through the first insulating film and the floating gates through the third insulating films.

19 Claims, 19 Drawing Sheets

SEMICONDUCTOR MEMORY DEVICE, METHOD OF MANUFACTURING THE SAME AND METHOD OF DRIVING THE SAME

BACKGROUND OF THE INVENTION

1. Field of the Invention

The present invention relates to a dual bit nonvolatile programmable read/write memory, a method of manufacturing the same, and a method of driving the same.

2. Description of the Prior Art

In the flash memory, the limit of miniaturization is decided by limits in the reduction in the voltages, the cell area, and the electrostatic capacity scaling. In contrast, the realization of the multivalue operation per one element is expected as the element technology to meet the trend of cost reduction.

Also, there is the memory like the mask ROM, which does not need the reprogramming, among the nonvolatile memories and it is desired to supply the product at a low price. In this case, the realization of the multivalue operation per one element is also watched with interest as the element technology to meet the lower cost.

Under such circumstances, the structure of the nonvolatile memory that makes it possible to realize the multivalue operation per one element is disclosed in the U.S. Patent (U.S. Pat. No. 6,011,725).

According to this Patent, the localization of the trapped charge by the MONOS (Metal Oxide Nitride Oxide Semiconductor) structure is utilized to obtain the 2-bit 4-value states. This system is the unique system that utilizes the event that the threshold value of the device can be decided by the fixed charges located locally near the source region and also the source region and the drain region are exchanged in operation, so that 2-bit (i.e., 4-value states) data can be generated by one transistor.

In FIG. 1A and FIG. 1B of this application, the similar element structure to that of the above U.S. Patent is shown. More particularly, the source/drain regions 6a, 6b serving as the source or the drain are formed at a distance on the surface of the one conductivity type semiconductor substrate 1, and the ONO (Oxide Nitride Oxide) structure in which the nitride film 3 is sandwiched by oxide films 2, 4 is formed on the channel region between them, and the control gate 5 is formed on the ONO structure. The overall stacked structure constitutes the MONOS structure.

In the programming of data, the avalanche breakdown is caused in the pn junction, that consists of the source/drain region 6a or 6b and the semiconductor substrate 1, by applying the program voltage to the source/drain region 6a or 6b to generate hot electrons. The electrons are injected into the ONO structure near the pn junction, and then trapped by the electron trap in the nitride film 3. At this time, normally the trapped electrons are located locally in the nitride film 3 near the pn junction.

FIG. 1B shows the state that the accumulated charges (trapped electrons) 7a and 7b are located locally in vicinity of the source/drain regions 6a and 6b respectively when the program voltage (Vpp) is applied separately to the source/drain regions 6a and 6b respectively. This state shows one state of the 2-bit 4-value states.

In the reading of this data, the current in one direction is detected while using the source/drain region 6a as the source and the source/drain region 6b as the drain, and then conversely the current in the opposite direction is detected while using the source/drain region 6b as the source and the source/drain region 6a as the drain. In both cases, since the accumulated charges 7a or 7b exist on the source side and thus the electric field to turn off the channel is generated, the detected current is small to indicate the "OFF" state.

However, problems described in the following still remain in the above nonvolatile memory.

(i) Programming Control

In the programming, as described above, normally the trapped electrons are located locally near the pn junction. However, there is the possibility that the trapped electron distribution in the nitride film is expanded by the excessive programming. In this case, since asymmetry of the operation is lost because the localization of the trapped electrons cannot be implemented, it is impossible to execute the dual bit operation. In order to prevent such excessive programming, the precise control of the programming time is needed.

Also, even if the precise control of the programming time can be carried out, the channel length must be set long to some extent in view of the expansion of the trapped electron distribution in the nitride film to locate locally the charges on both sides of the nitride film at the same time. Therefore, it may be concluded that the structure in the prior art is not suitable for the higher density achieved by the miniaturization.

(ii) Variation in the Threshold Value

Since the avalanche breakdown is caused locally, it is difficult to localize the fixed charged uniformly over the overall area along the channel width direction shown in FIG. 1A.

SUMMARY OF THE INVENTION

It is an object of the present invention to provide a semiconductor memory device which has high reliability and makes it possible to achieve miniaturization and a higher density, and each element of which is operated at multi-values.

It is another object of the present invention to provide a semiconductor memory device capable of achieving lower voltages in a programming voltage and much more expanding a current window defined later.

It is still another object of the present invention to provide a method of manufacturing the above semiconductor memory device.

It is yet still another object of the present invention to provide a method of driving the above semiconductor memory device.

The gist of the inventions set forth in claims will be explained hereunder. In this case, some portions will be explained with reference to the drawings. This intends to explain contents of the invention comprehensively, but this does not intend to limit the scope of the invention.

A semiconductor memory device set forth in claim 1 of the present invention containing a semiconductor memory element, the element comprises a one conductivity type semiconductor substrate in which convex portions having a pair of opposing side surfaces is provided, a pair of opposite conductivity type source/drain regions formed on a surface of the semiconductor substrate on both sides of the convex portion, a first insulating film for covering upper surface of the convex portion, second insulating films for covering the side surfaces of the convex portion and the source/drain regions, a pair of floating gates provided on the sides surfaces of the convex portions to oppose to the side surfaces and the source/drain regions via the second insulating film respectively, third insulating films formed on the floating gates, and control gate opposing to the upper surface of the convex portion via the first insulating film and opposing to the floating gates via the third insulating films respectively.

In this case, as set forth in claim 2, a region neighboring to the side surfaces and upper surface of the convex portion put between a pair of the source/drain regions acts as a channel region, and a pair of floating gates act as charge accumulating regions for accumulating charges.

In the present invention, two bits are formed per one element by a pair of the floating gates, and 4-value states can be formed by possible combinations of the charge accumulation or no charge accumulation into the one floating gate and the charge accumulation or no charge accumulation into the other floating gate.

Also, since the floating gates are provided on both side surfaces of the convex portion formed on the surface of the semiconductor substrate and also side surfaces of the convex portion are utilized as a channel respectively, a element forming area can be reduced. Also, since the source/drain regions are provided under the floating gates, the higher density of the semiconductor memory device can be achieved.

In the programming, hot carriers (high energy carriers) generated by the electric field directed from the source to the drain are employed as the injection charge. At this time, the energy required for the hot carriers to exceed the energy barrier of the gate insulating film is supplied by applying the necessary voltage for programming to the drain. More particularly, as shown in FIG. 6, the carriers extracted from the source are accelerated during the traveling in the channel region to get the energy, and then exceeds the energy barrier of the gate insulating film 22 to jump into the floating gate 27b. At this time, since the floating gate 27b is present in the acceleration direction of the carriers in the channel on the upper surface of the convex portion, the carriers are injected into the floating gate 27b as they are without the change of direction. Accordingly, the energy of the carriers accelerated in a direction of the floating gate 27b is never lost by scattering and is practically used as the energy to exceed the energy barrier of the gate insulating film 22 as they are. Therefore, according to the present invention, it is possible to execute the programming by the low voltage.

Also, since a pair of floating gates as the charge accumulating portions are separately mutually to put the convex portion between them, in the programming, the charges injected into the floating gates do not interfere mutually, and thus contents of the data can be clearly distinguished. In addition, since the floating gates are formed of the conductor, the injected hot carriers (charges) can be distributed uniformly in the floating gates. Accordingly, "ON"/"OFF" of the transistors can be controlled perfectly.

Further, during the programming, in the non-selected cell transistor, 0 V is applied to the control gate and the source, and the programming voltage is applied to the drain, but the potential of the floating gates is pulled up to the drain potential by the coupling capacitance between the drain and the floating gate. Therefore, the potential difference between the drain and the floating gate is reduced. As a result, the dielectric breakdown due to the inter-band tunneling, etc. that are caused by the high electric field to the insulating film between the drain and the floating gate can be prevented.

In addition, since the floating gates are provided on the source/drain regions via the insulating film, the potential of the floating gate is largely affected by the drain voltage via the coupling capacitance. Accordingly, since the potential of the floating gate is pulled up by the drain voltage even if the injected electrons are accumulated in the floating gate on the drain side, a drain current can be increased.

In contrast, the potential of the floating gate on the source side is pulled down by the source voltage applied to the source via the coupling capacitance of the insulating film between the floating gate and the source. Therefore, the potential of the floating gate that is pulled down by the injected electrons into the floating gate on the source side is further pulled down by the source voltage. As a result, even if the high voltage is applied to the control gate, the channel can be still cut off.

The pulling-up of the potential of the floating gate by the above drain voltage and the pulling-down of the potential of the floating gate by the source voltage can generate the effect to increase the so-called "current window". Here, the current window is the index of the margin in a discrimination of "ON" state and "OFF" state. In other words, it is a difference between the lowest level of the drain current indicating the "ON" state and the highest level of the drain current indicating the "OFF" state. More particularly, it is corresponding to the difference between the drain current values obtained when the voltages are applied in different directions between the drain and the source of the memory element in which "1" is programmed onto one floating gate only.

Also, in the semiconductor memory device set forth in claims 4 to 9, a plurality of semiconductor elements are arranged in columns and rows.

In claim 4, the semiconductor convex portions in which the memory elements are formed at intersecting regions of the rows and the columns are arranged like the islands to implement the element isolation such that the mutual interference between neighboring memory elements is not generated.

While, in claims 5 to 9, a plurality of memory elements are formed on the stripe-shaped convex portions. In this manner, in case the memory elements are left discontinuously at a distance in the stripe-shaped convex portion in one column, high concentration impurity regions (element isolation layers) are formed between neighboring memory elements to accomplish isolation between the elements without fail.

In the semiconductor memory device driving method of the present invention, the programming of the data, the reading of the stored data, and the erasing of the programmed and stored data can be carried out as follows.

The programming of the data is carried out in the following way. That is, the voltage is applied to at least any one of a pair of the source/drain regions 23a, 23b, for example, the source/drain region 23b in FIG. 6. And then, the high-energy carriers that can exceed the energy barrier of the insulating film 22 are generated in the electric field which is built in the peripheral region of the source/drain region 23a, 23b and the channel region, to inject and accumulate the charges in the floating gate 27b.

Also, as shown in FIG. 7A to FIG. 7D, the reading of the stored data is carried out to pass drain currents through a transistor while exchanging a source and drain of the transistor and to detect the drain currents.

More particularly, in case that the source/drain region 23a or 23b on the side of the floating gate 27a or 27b in which the charges are accumulated is used as the source, the accumulated charges produce the potential to turn off the channel. In addition, since a potential of the floating gate 27a or 27b is pulled down by the high coupling capacitance between the floating gate and the source to lower its potential, the drain current can be easily cut off by a small amount of the accumulated charges.

In contrast, in case the source/drain region 23a or 23b on the side of the floating gate 27a or 27b in which the charges are accumulated is used as the drain, a potential of the floating gate 27a or 27b is pulled up by the high coupling capacitance to increase its potential close to the drain voltage. Therefore, even if the accumulated charges are present in the floating gate 27a or 27b, the influence on the drain current is small and thus the current value is not so reduced.

As shown in FIG. 7D, in the case that the accumulated charges are present in both the floating gates 27a and 27b, the drain current is brought into the cut-off state on the basis of the above operation in either case if any one of the floating gates 27a and 27b is set to the source side or the drain side. Because the accumulated charges are present in the floating gate 27a or 27b of the source side in either case.

Also, as shown in FIG. 7B and FIG. 7C, in case that the accumulated charges are present in any one of the floating gates 27a and 27b, the drain current is brought into the cut-off state when the floating gate 27a or 27b in which the charges are accumulated is set to the source side, but the drain current flows when the floating gate 27a or 27b in which the charges are accumulated is set to the drain side. In other words, the drain current flows or not depending on the direction of the voltage that is applied between the source and the drain.

In addition, as shown in FIG. 7A, if the charges are accumulated in neither the floating gate 27a nor 27b, the potential of the floating gate 27a or 27b is increased by the gate voltage applied to the control gate 30a. For this reason, the "ON" state of the channel is maintained, and thus the drain current still flows even if the direction of the applied voltage between the source and the drain is changed.

In this manner, if the voltages are applied while the source and the drain are exchanged and then the currents passing through the transistor are detected, it is possible to detect four different states.

Further, since the floating gates and the source/drain regions are overlapped with each other, it is possible to exhaust the charges accumulated in the floating gates into the source/drain regions in erasing the stored data.

Besides, in the semiconductor memory device manufacturing method set forth in claim 10, the convex portions each having a pair of opposing side surfaces are formed, and then the opposite conductivity type impurities are introduced into a surface layer of the semiconductor substrate on both sides of the convex portion such that two source/drain regions are formed on both sides of the convex portion to put the convex portion between them. In addition, a pair of floating gates are formed on the side surfaces of the stripe-shaped convex portion via the insulating film (second insulating film) by anisotropic-etching the first conductive film.

In this manner, according to the semiconductor memory device manufacturing method, since the source/drain regions and the floating gates can be formed in a self-alignment manner, further miniaturization can be achieved.

Moreover, as shown in FIG. 10H, the thick insulating films 34 are formed in the regions which are located on the common source/drain regions 23a, 23b between the convex portions 24a, 24b and in which the source/drain regions 23a, 23b oppose to the control gates 30a, 30b formed later. As a result, the dielectric-breakdown resistance of the semiconductor memory device can be improved.

DESCRIPTION OF THE PREFERRED EMBODIMENTS

Embodiments of the present invention will be explained with reference to the accompanying drawings hereinafter.

(1) Configuration of Semiconductor Memory Device

Figure 1A:
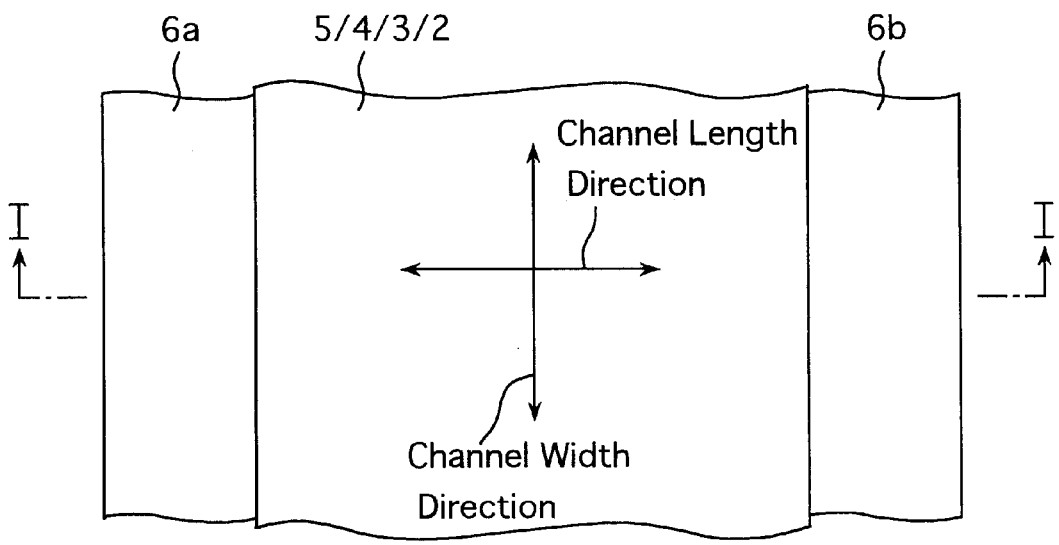
FIG. 1A is a plan view of the semiconductor memory device in the prior art.
Figure 1B:
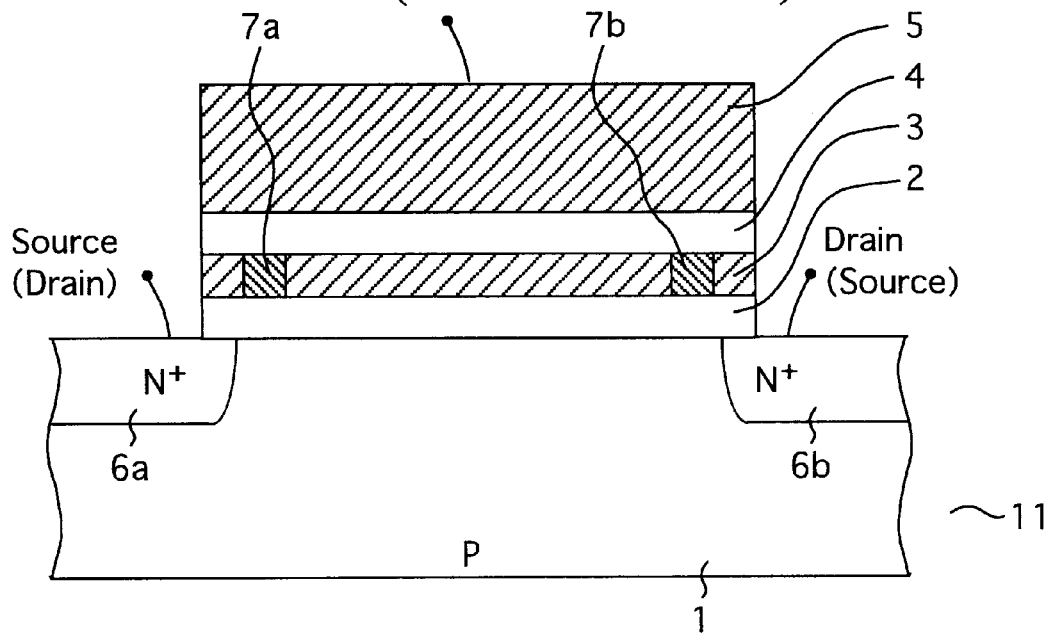
FIG. 1B is a sectional view of the same taken along a I—I line in FIG. 1A.
Figure 2:
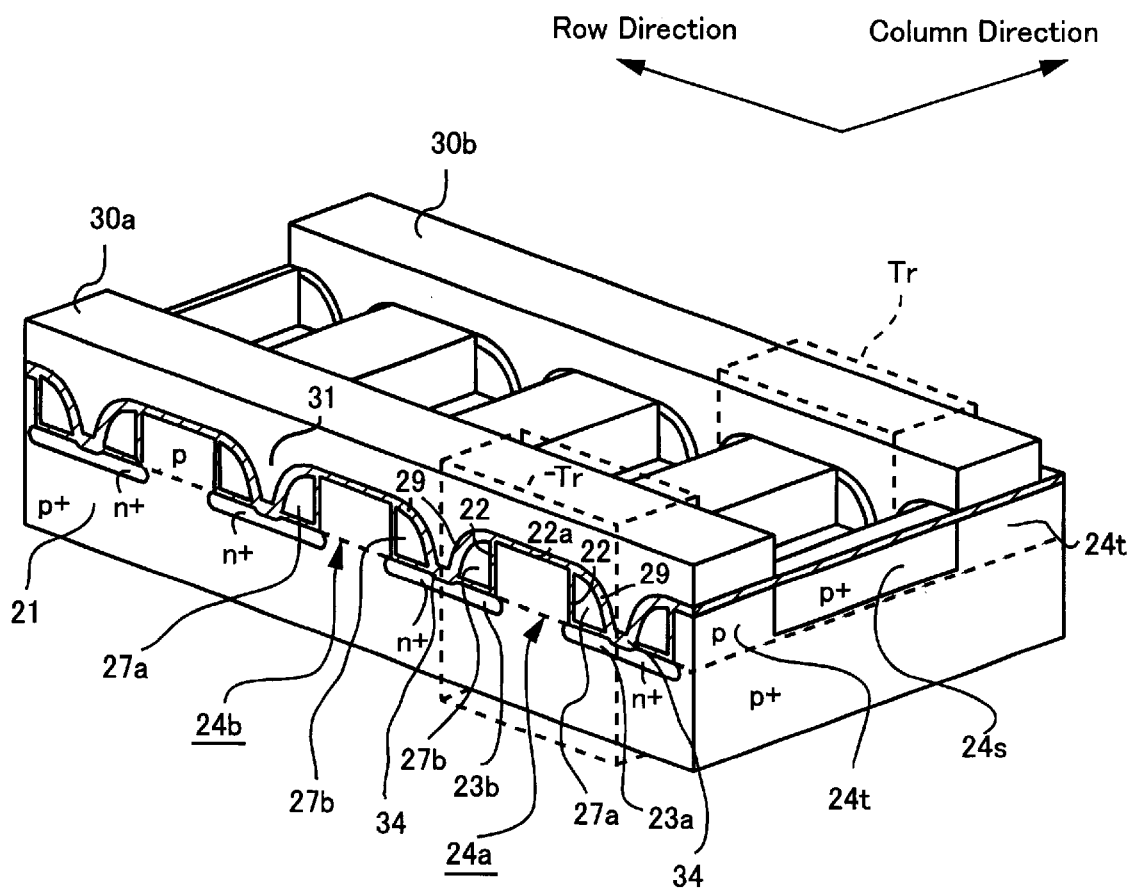
FIG. 2 is a perspective view of a semiconductor memory device according to an embodiment of the present invention.

FIG. 2 is a perspective view showing a configuration of a semiconductor memory device according to an embodiment of the present invention.

As shown in FIG. 2, in the semiconductor memory device, a plurality of convex silicon layers (one conductivity type stripe-shaped convex portions) 24a, 24b, . . . are provided in the column direction at a distance mutually on a semiconductor substrate, and control gates 30a, 30b, . . . are provided in the row direction at a distance mutually thereon. Semiconductor memory elements (transistors) Tr are formed on convex silicon layers 24a, 24b, . . . in their intersecting areas.

(Basic Configuration of Semiconductor Memory Element)

A basic configuration of the transistor (semiconductor memory element) located in the intersecting area of the control gate 30a and the convex silicon layer 24a among the transistors Tr shown in FIG. 2 will be explained with reference to FIG. 3B hereinafter.

In the transistor, the p-type convex silicon layer 24a having a pair of opposing side surfaces is provided to project from a surface of a p-type silicon base body 21. They constitute a semiconductor substrate.

A pair of n-type source/drain regions 23a, 23b are formed on the surface of the silicon base body 21 on both sides of the convex silicon layer 24a.

An upper surface of the convex silicon layer 24a is covered with a first gate insulating film (first insulating film) 22a made of a silicon oxide film. Side surfaces of the convex silicon layer 24a and surfaces of first and second source/drain regions 23a, 23b are covered with a second insulating film 22 made of the silicon oxide film.

A first floating gate 27a is provided from one side surface of the convex silicon layer 24a to a surface of the first source/drain region 23a via the second insulating film 22. A second floating gate 27b is provided from the other side surface of the convex silicon layer 24a to a surface of the second source/drain region 23b via the second insulating film 22. Overall bottom surfaces of the floating gates 27a, 27b are located on corresponding source/drain regions 23a, 23b respectively. The first and second floating gates 27a, 27b are formed of conductor such as polysilicon with low resistance, etc., for example. A pair of floating gates 27a, 27b act as a charge accumulating portion for accumulating the charges.

The second insulating film 22 put between the floating gates 27a, 27b and the convex silicon layer 24a serves as the second gate insulating film. It is preferable that a film thickness of the second insulating film 22 should be set to less than 100 nm such that the hot carriers being traveling in the channel can exceed the energy barrier of the second insulating film 22 and that the electric field by the accumulated charges can have an enough influence on the channel. On the other hand, it is preferable that the film thickness should be set to more than 3 nm such that the leakage of the accumulated charges can be reduced as small as possible. Also, surfaces of the floating gates 27a, 27b are covered with third insulating films 29 made of the silicon oxide film.

A control gate 30a is provided to extend on the first floating gate 27a, an upper surface of the convex silicon layer 24a, and the second floating gates 27a, 27b. The control gate 30a opposes to the upper surface of the convex silicon layer 24a via the first insulating film 22a, and also opposes to the floating gates 27a, 27b via the third insulating films 29.

A region that is put between the first and second source/drain regions 23a, 23b and extends from one side surface of the convex silicon layer 24a to the other side surface thereof via an upper surface of the convex silicon layer 24a acts as the channel.

Figure 4:
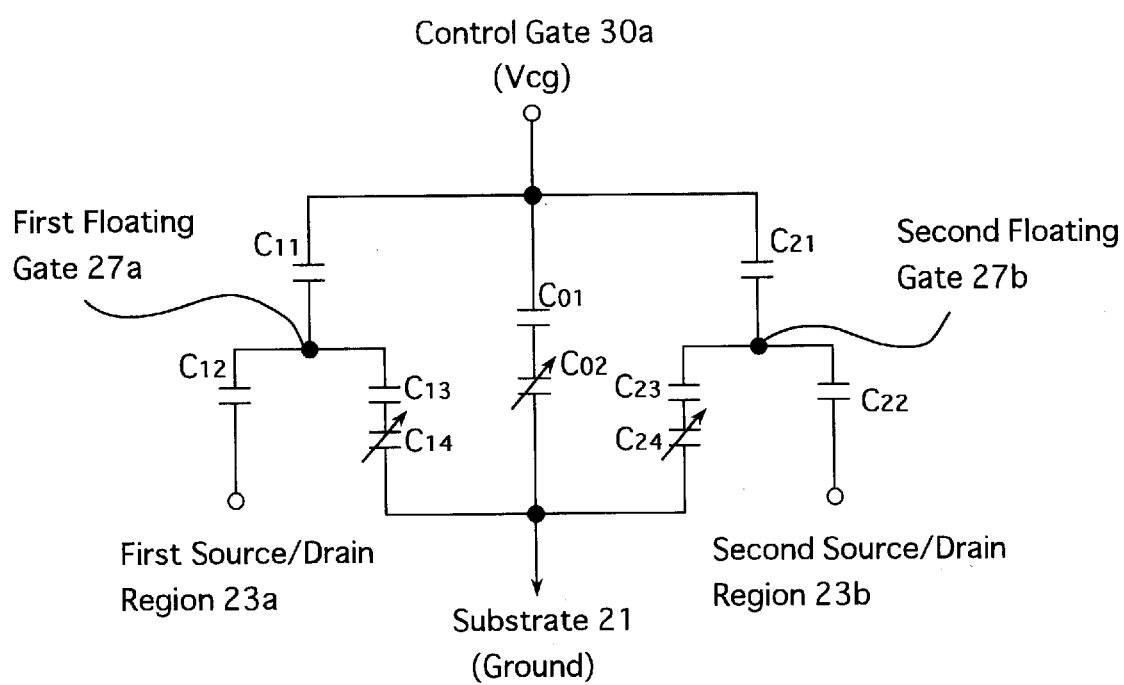
FIG. 4 is an equivalent circuit diagram showing an coupling capacitance of a gate peripheral portion of the semiconductor memory element according to the embodiment of the present invention.

In the above configuration, the coupling capacitances between the respective parts are arranged as shown in FIG. 4. More particularly, there are a coupling capacitance C01 by the insulating films 22a and a coupling capacitance C02 by the depletion layer generated in the convex silicon layer 24a between the control gate 30a and the substrate 21.

Also, there are coupling capacitances C11, C21 between the floating gates 27a, 27b and the control gate 30a respectively.

Also, there are coupling capacitances C12, C22 between the floating gates 27a, 27b and the corresponding source/drain regions 23a, 23b respectively.

Also, there are coupling capacitances C13, C23 generated by the insulating films 22 and coupling capacitances C14, C24 generated by the depletion layer in the convex silicon layers 24a between the floating gates 27a, 27b and the substrate 21.

(Overall Configuration of Semiconductor Memory Device)

Next, an overall configuration of the semiconductor memory device containing peripheral circuits will be explained hereunder.

As explained above with reference to FIG. 2, the transistors Tr are arranged in rows and columns in the semiconductor memory device.

Figure 11A:
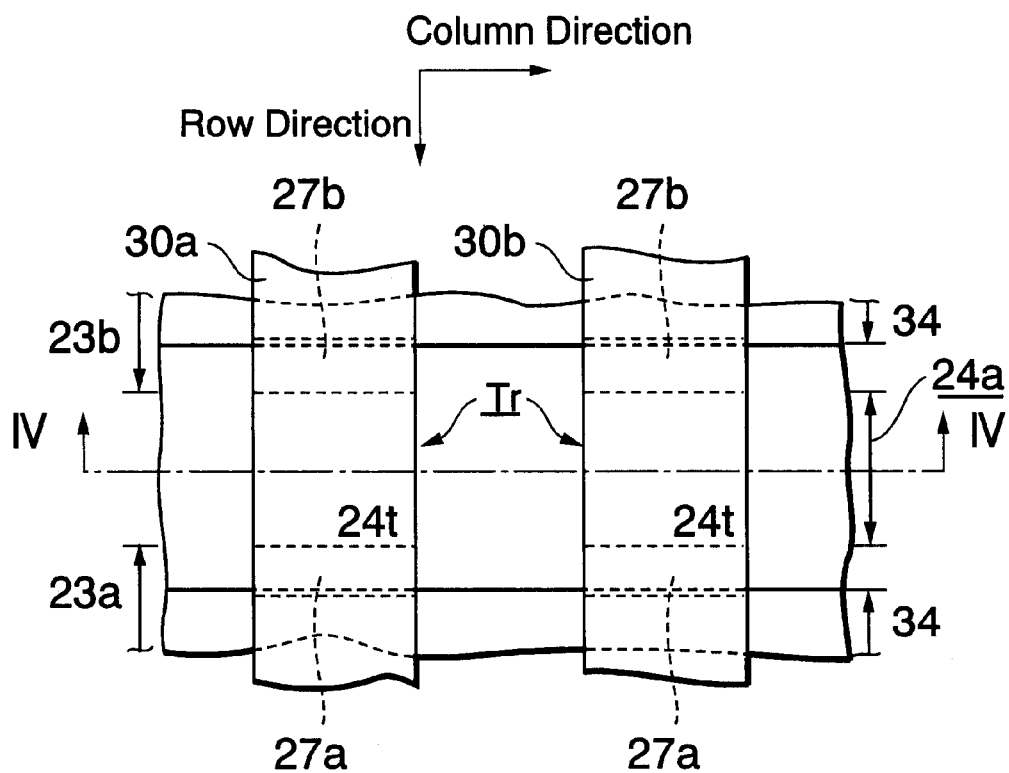
FIG. 11A is a plan view showing another configuration of the semiconductor memory device manufacturing method according to the embodiment of the present invention.
Figure 11B:
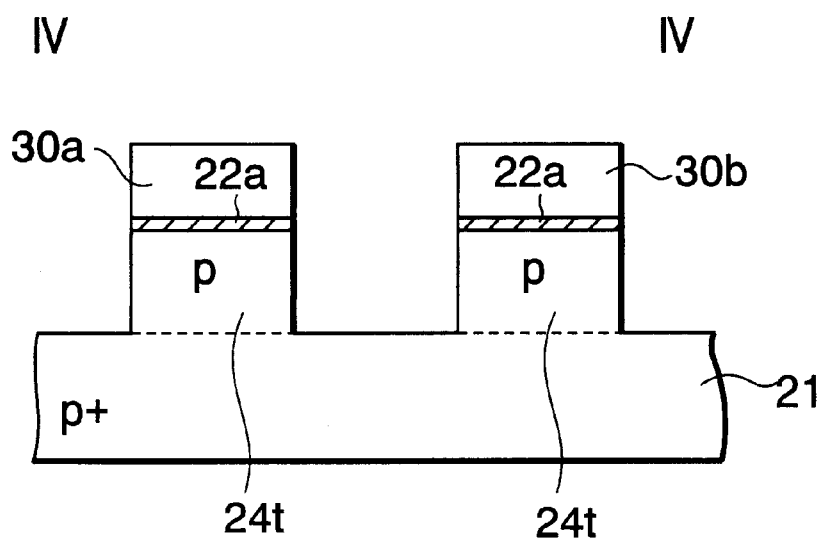
FIG. 11B is a sectional view taken along a IV—IV line in FIG. 11A.

As shown in FIG. 2, the transistors Tr aligned in a column are arranged discontinuously at a distance on the convex silicon layer 24a, 24b, . . . In this case, the element isolation can be executed without fail by putting the high concentration impurity regions (element isolation layers) 24s . . . between operation layers 24t of neighboring transistors Tr. As shown in FIG. 11A and FIG. 11B, the mutual interference between the neighboring transistors Tr may be prevented by removing regions between the neighboring transistors Tr in one column. A detail structure is described in the subsequent term of manufacturing method.

Once again, as shown in FIG. 2, the source/drain regions 23b put between the convex silicon layers 24a, 24b in the neighboring columns are formed integrally, and are used in common between the transistors Tr in the neighboring columns. This structure is similarly true of the transistors Tr in other neighboring columns. The source/drain regions 23a, 23b, . . . function as the bit lines (BL) respectively.

In addition, the control gates 30a, 30b are provided to extend over a plurality of transistors in the neighboring columns. The control gates 30a, 30b oppose to the source/drain regions 23a, 23b, . . . via a thick insulating film 34 in the concave portion 31 between the floating gates 27a, 27b of the transistors of neighboring columns. The thick insulating film 34 has a film thickness that is thicker than the insulating film on the peripheral portion.

The control gates 30a, 30b are formed of a stripe-shaped polysilicon film (conductive film) and act as the word lines (WL) respectively.

Figure 3A:
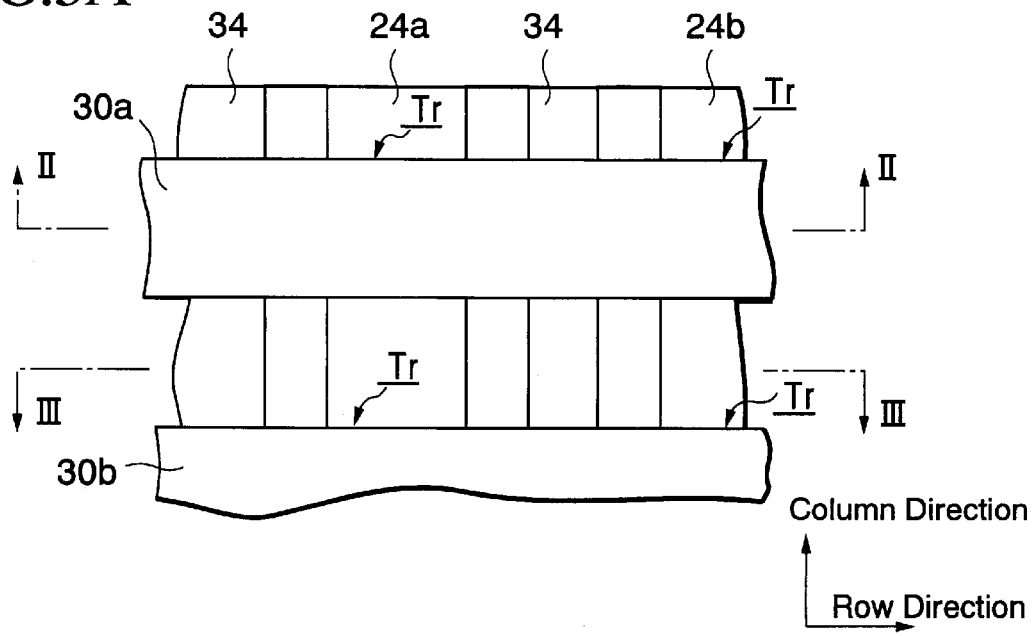
FIG. 3A is a partial plan view of the semiconductor memory device according to the embodiment of the present invention in FIG. 2.
Figure 3B:
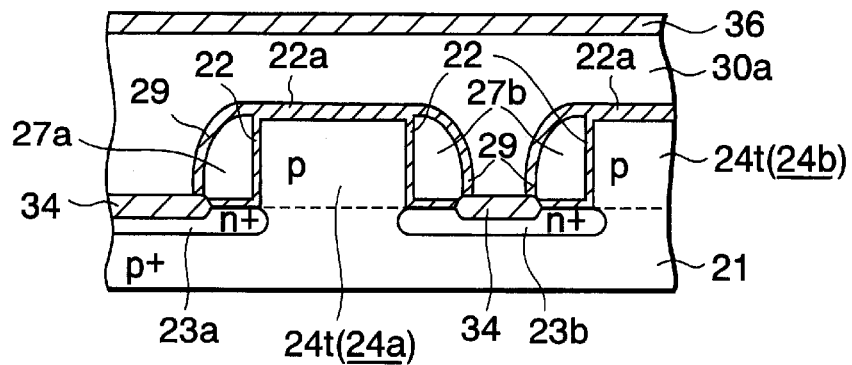
FIG. 3B is a set of sectional views of the same taken along a II—II line and a III—III line in FIG. 3A.
Figure 3C:
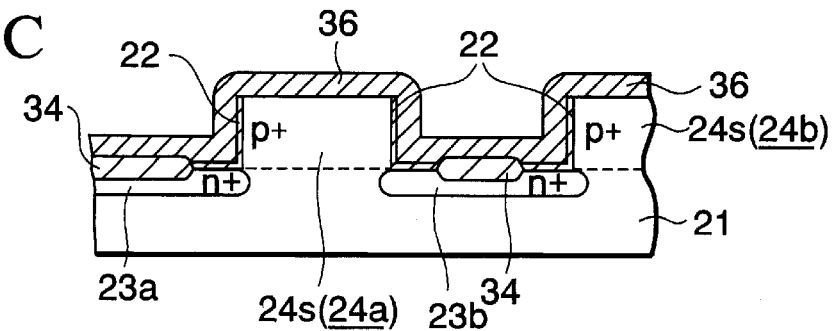

A silicon oxide film 36, although it is not shown in FIG. 2, is formed on the overall surface of the element as shown in FIG. 3B.

Next, an example of peripheral circuits of the semiconductor memory device will be explained hereinafter.

Figure 5:
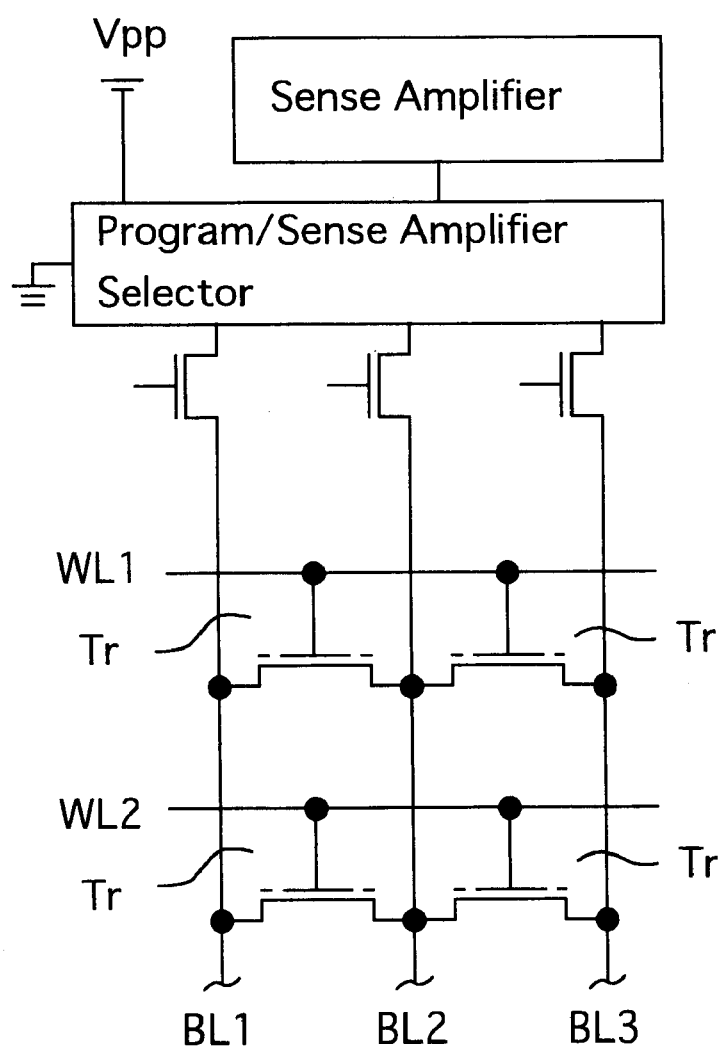
FIG. 5 is a circuit diagram of the semiconductor memory device as the embodiment of the present invention, which comprises a plurality of transistors that are arranged in rows and columns and driving circuits.

FIG. 5 is a circuit diagram showing a 2-row 2-column partial arrangement of the transistors out of the overall arrangement of a plurality of transistors that are arranged in rows and columns, and a program voltage supply portion and a sense amplifier portion of peripheral circuits.

As shown in FIG. 5, the program voltage supply portion and the sense amplifier are connected to the source/drain regions 23a, 23b, 23c . . . by the bit lines BL1, BL2, BL3 via the program/sense amplifier selector. The word lines WL1, WL2 are connected to the control gates 30a, 30b.

Any one of the program voltage supply portion and the sense amplifier is selected by the program/sense amplifier selector to be connected to the bit lines BL1, BL2, BL3.

The data are programmed in the transistor Tr by the program voltage supply portion. Then, the stored data are read out with the sense amplifier by detecting respective currents which pass through the transistor Tr while current directions are exchanged between the neighboring bit lines BL1/BL2, BL2/BL3.

As described above, according to the semiconductor memory device of the embodiment of the present invention, two bits per one element are formed by a pair of floating gates 27a, 27b, and four values can be formed by possible combinations of the charge accumulation or no charge accumulation into the first floating gate 27a and the charge accumulation or no charge accumulation into the second floating gate 27b.

Also, since the floating gates 27a, 27b are provided on both side surfaces of the convex silicon layer 24a formed on the surface of the semiconductor base body 21 and the side surfaces of the convex silicon layer 24a are utilized as the channel, the element forming area can be reduced. Also, since the source/drain regions 23a, 23b are provided under the floating gates 27a, 27b, the higher density of the semiconductor memory device can be achieved.

Also, the thick insulating film 34 is provided between the control gates 30a, 30b and the source/drain regions 23a, 23b in areas where the control gates 30a, 30b oppose to the source/drain regions 23a, 23b and thus the high potential difference is generated. Therefore, the dielectric breakdown in these areas can be prevented.

(2) Semiconductor Memory Device Driving Method

Next, a semiconductor memory device driving method as an embodiment of the present invention will be explained by using the semiconductor memory device in FIG. 2 and with reference to FIG. 6A, FIG. 6B, FIG. 7A to FIG. 7D, FIG. 8 and FIG. 9 hereunder.

(i) Programming Operation

Figure 6A:
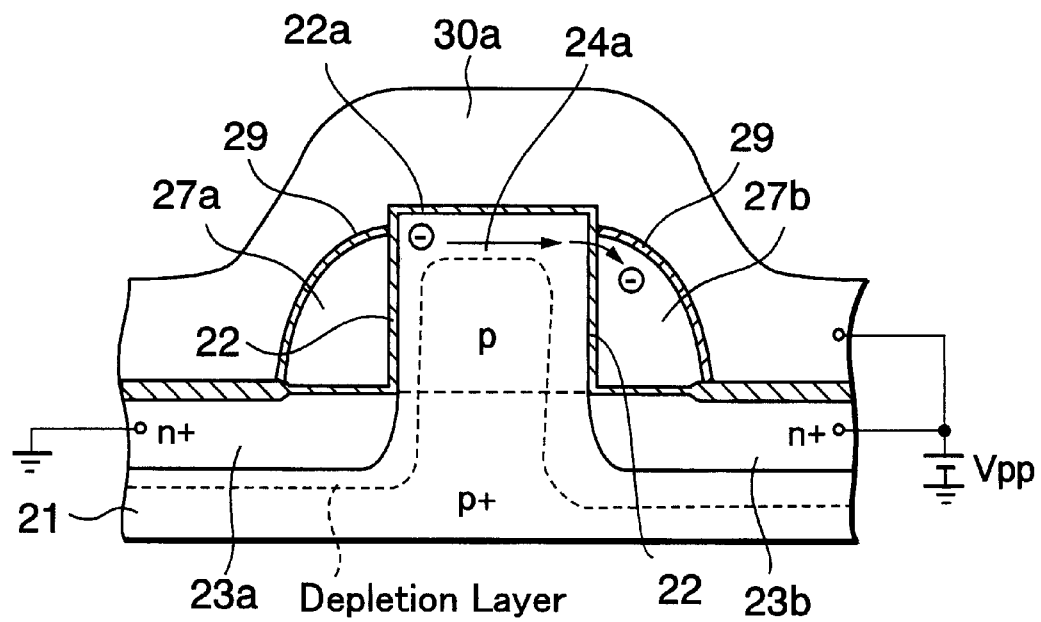
FIG. 6A is a sectional view for explaining a programming method of the semiconductor memory device driving method employing the semiconductor memory device of the embodiment of the present invention.
Figure 6B:
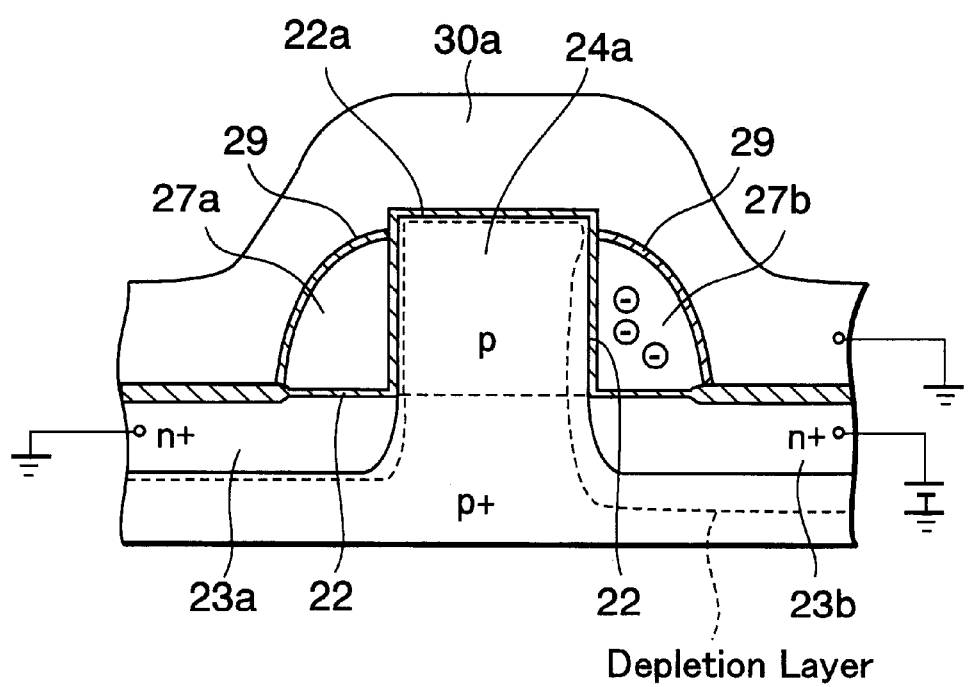
FIG. 6B is a sectional view showing an aspect of the non-selected semiconductor memory element in the programming operation.

FIG. 6A is a sectional view showing generating and moving behaviors of the hot carries (high energy carries) in the peripheral portions of the floating gates 23a, 23b in the programming operation in the driving method. FIG. 6B is a sectional view showing an aspect of the non-selected semiconductor memory element in the programming operation.

In this embodiment, as shown in FIG. 6A, the charges of the hot carriers are accumulated in the floating gate 27b on the drain region 23b side. The first source/drain region 23a is used as the source and the second source/drain region 23b is used as the drain. In the programming, the hot carries generated by the electric field directed from the source region 23a to the drain region 23b are employed as the injection carriers.

In order to execute the programming operation, the programming voltage (Vpp) of about ±4.5 V is applied to the drain region 23b and the control gate 30a, and the source region 23a is set to 0 V.

Accordingly, the electric field directed from the source 23a to the drain 23b is generated in the channel of the convex silicon layer 24a. The electrons extracted from the source region 23a are accelerated by the electric field during when they are traveling the channel to get the energy, and exceed the energy barrier of the gate insulating film 22 to jump into the second floating gate 27b.

At this time, since the floating gate 27b exists on the upper channel of the convex silicon layer 24a in the acceleration direction of the electrons, the electrons are injected into the floating gate 27b as it is not to change their direction. Therefore, the energy of the electrons accelerated in the floating gate 27b direction is used practically as the energy to exceed the potential of the gate insulating film 22 as it is without the loss due to the scattering. As a result, it is possible to execute the programming by the low voltage.

Also, since a pair of floating gates 27a, 27b serving as the charge accumulating portions are separated mutually to put the convex silicon layer 24a between them, the charges injected into the floating gates 27a, 27b never interfere with each other and thus contents of the programming data can be clearly distinguished. In addition, since the floating gates 27a, 27b are formed of the conductor, the injected hot carriers (charges) can be distributed uniformly in the floating gates 27a, 27b. Accordingly, the "ON"/"OFF" of the transistors can be controlled perfectly.

In this case, the hot electrons that exceed the energy barriers of the insulating films 22a, 29 and are injected into the control gate 30a are exhausted immediately to the power supply connected to the control gate 30a via the control gate 30a.

Further, during the programming of the data, as shown in FIG. 6B, in the non-selected transistor, 0 V is applied to the control gate 30a and the source 23a, and the programming voltage Vpp (Vd) is applied to the drain 23b via the bit line connected to the selected transistor. But the potential of the floating gate 27b is pulled up to the drain potential Vd (Vpp) by the coupling capacitance between the drain 23b and the floating gate 27b. Therefore, the potential difference between the drain 23b and the floating gate 27b is reduced. As a result, the dielectric breakdown due to the inter-band tunneling, etc. that are caused by the high electric field to the insulating film 22 between the drain 23b and the floating gate 27b can be prevented.

The four-value states as shown in FIG. 7A, FIG. 7B, FIG. 7C and FIG. 7D can be formed by executing the programming operation as shown in FIG. 6A.

FIG. 7A, FIG. 7B, FIG. 7C and FIG. 7D are sectional views of the semiconductor memory element showing four different charge accumulation states respectively.

Here, the state that the carriers are accumulated in the first floating gate 27a is set as the first binary value of the first bit, and the state that the carriers are not accumulated in the first floating gate 27a is set as the second binary value of the first bit. Also, the state that the carriers are accumulated in the second floating gate 27b is set as the third binary value of the second bit, and the state that the carriers are not accumulated in the second floating gate 27b is set as the fourth binary value of the second bit.

Figure 7A:
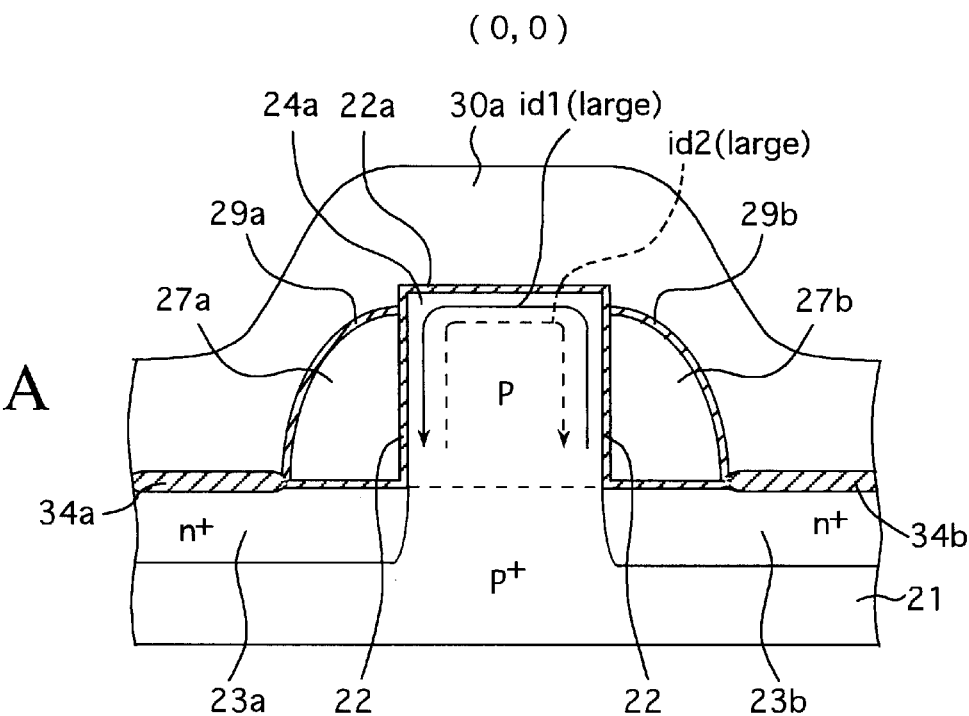
FIG. 7A to FIG. 7D are sectional views explaining a reading method of the semiconductor memory device driving method as the embodiment of the present invention.

FIG. 7A shows the state that the charges are not accumulated in both the first and second floating gates 27a, 27b. In other words, FIG. 7A shows such a data that the second binary value is set in the first bit and also the fourth binary value is set in the second bit. This data is represented as (0, 0).

Figure 7B:
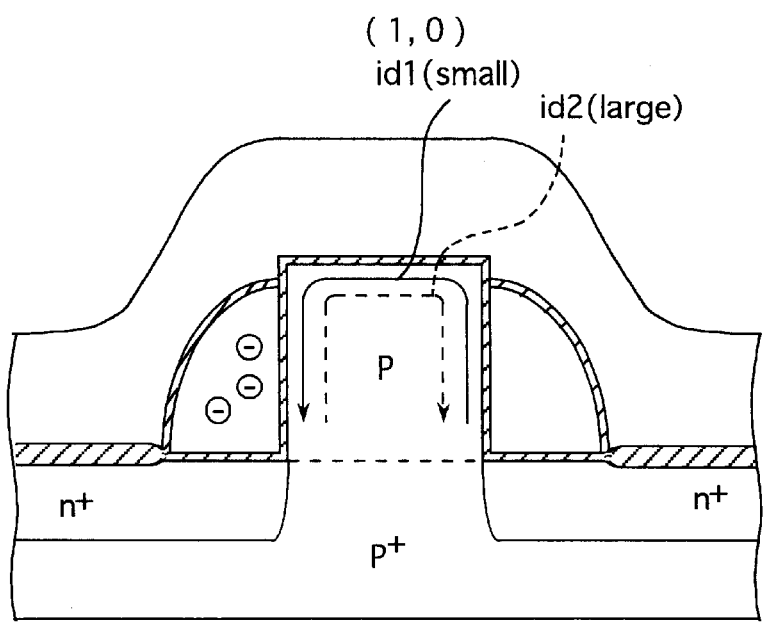

FIG. 7B shows the state that the charges are accumulated only in the first floating gate 27a. In other words, FIG. 7B shows such a data that the first binary value is set in the first bit and also the fourth binary value is set in the second bit. This data is represented as (1, 0).

Figure 7C:
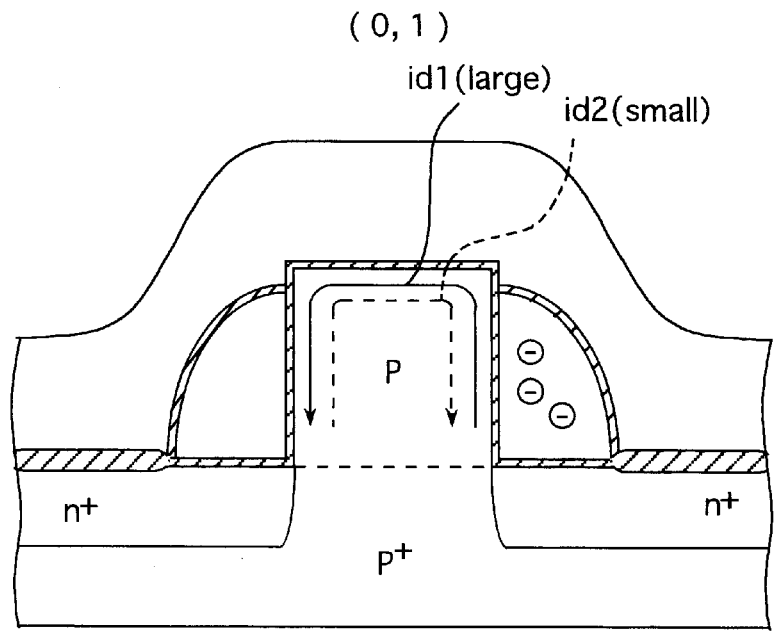

FIG. 7C shows the state that the charges are accumulated only in the second floating gate 27b. In other words, FIG. 7C shows such a data that the second binary value is set in the first bit and also the third binary value is set in the second bit. This data is represented as (0, 1).

Figure 7D:
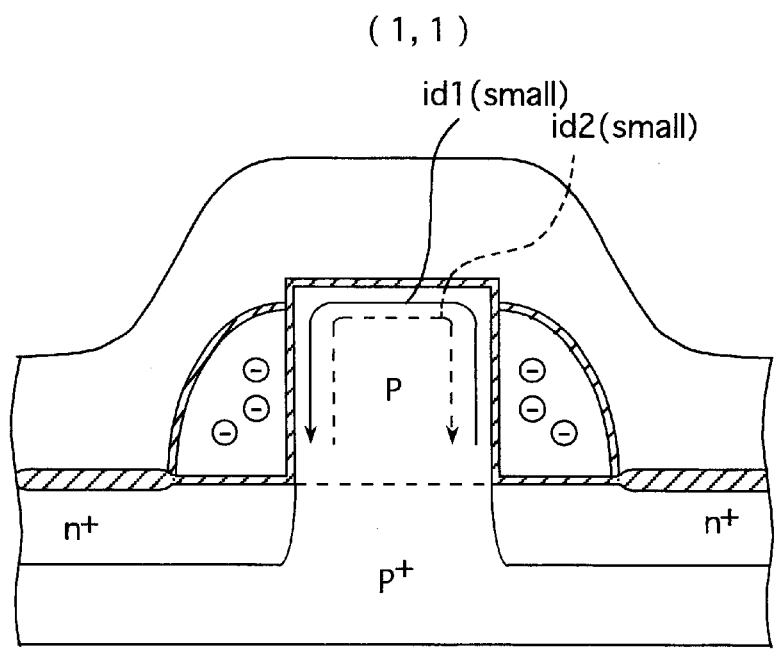

FIG. 7D shows the state that the charges are accumulated in both the first and second floating gates 27a, 27b. In other words, FIG. 7D shows such a data that the first binary value is set in the first bit and also the third binary value is set in the second bit. This data is represented as (1, 1).

(ii) Reading Operation

Next, an operation of reading the data programmed as described above will be explained with reference to FIG. 7A, FIG. 7B, FIG. 7C, FIG. 7D and FIG. 8 hereunder.

Figure 8:
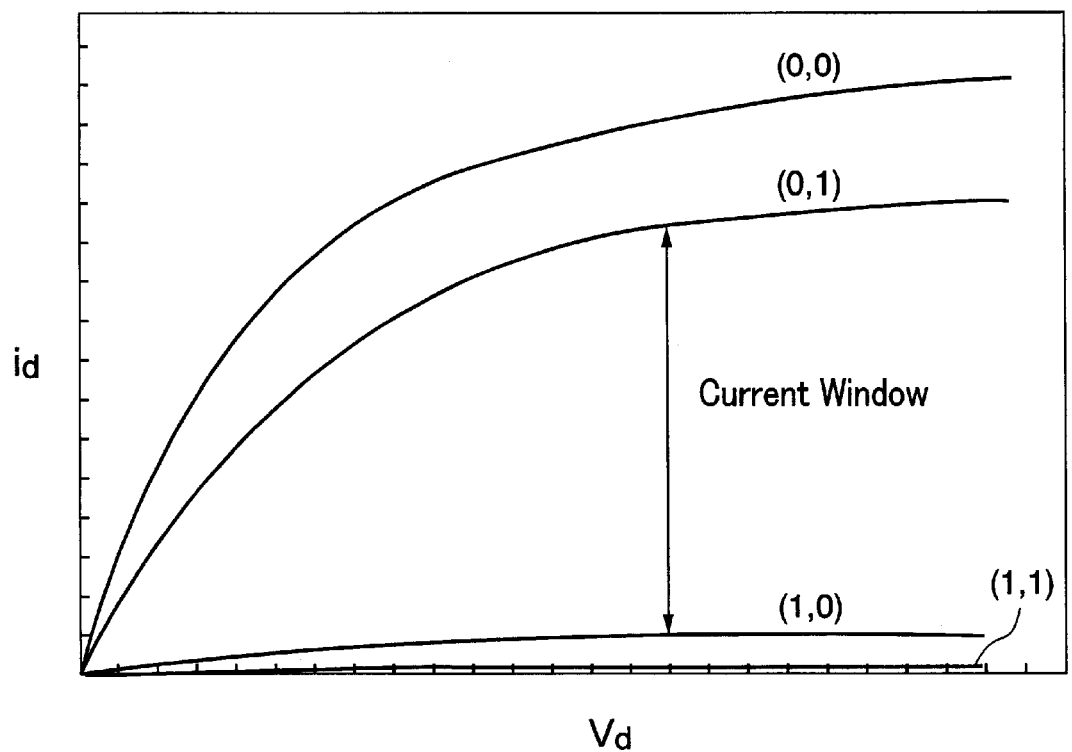
FIG. 8 is a graph showing a drain voltage-drain current characteristic in the "ON" state and the "OFF" state in four-value states.

FIG. 8 is a graph showing the characteristic of the drain current id with respect to the drain voltage Vd.

In FIG. 7A, FIG. 7B, FIG. 7C, and FIG. 7D, assume that the detected current directed from the second source/drain region 23b to the first source/drain region 23a is id1 (indicated by a solid line), and the detected current flowing in the opposite direction to the current id1 is id2 (indicated by a dotted line).

In the reading operation of the stored data, the gate voltage Vcg (2.3 V) is applied to the control gate 30a. The read voltage Vd (1.5 V) is applied to the second source/drain region 23b as the drain. The first source/drain region 23a as the source is grounded (Vs=0V). At this time, since the drain current id1 flows between the source region 23a and the drain region 23b, such drain current id1 is detected.

In turn, the gate voltage Vcg (2.3 V) is applied to the control gate 30a. The read voltage Vd (1.5 V) is applied to the first source/drain region 23a as the drain. The second source/drain region 23b as the source is grounded. At this time, since the drain current id2 flows between the source 23b and the drain 23a, such drain current id2 is detected.

In the reading operation of the data (0, 0), since the electrons are not accumulated in both the floating gates 27a, 27b, their potentials are not pulled down. Therefore, the potentials of the floating gates 27a, 27b are pulled up by the gate voltage Vcg and the drain voltage Vd. Also, since the charge accumulation state is bilaterally symmetric, both the drain currents id1, id2 have a large value even if the source and the drain are exchanged. The id-Vd characteristic of the drain current id1 is shown in FIG. 8.

In the reading operation of the data (1, 0), first the gate voltage Vcg and the drain voltage Vd are applied as explained above in order to detect the drain current id1. The potential of the floating gate 27a on the source side, in which the charges are accumulated, is pulled down by the accumulated electrons. In addition, the potential of the floating gate 27a on the source side is pulled down by the source voltage Vs via the coupling capacitance between the floating gate 27a and the source 23a. Therefore, the channel can be still cut off irrespective of the application of the gate voltage Vcg and the drain voltage Vd. As a result, the drain current id1 can be reduced.

Then, the source and the drain are exchanged. In order to detect the drain current id2, the gate voltage Vcg and the drain voltage Vd are applied as explained above. The potential of the floating gate 27b on the source 23b side, in which the electrons are not accumulated, is pulled up by the gate voltage Vcg. In contrast, the potential of the floating gate 27a on the drain 23a side, in which the electrons are accumulated, is pulled up by the gate voltage Vcg and the drain voltage Vd via the coupling capacitance. Therefore, even if the electrons are accumulated in the floating gate 27a on the drain 23a side, the channel can be turned on and thus the drain current id2 can be relatively increased.

FIG. 8 shows the drain current id1 in the "OFF" state when the first source/drain region 23a on the first floating gate 27a side in which the electrons are accumulated is used as the source.

In the reading operation of the data (0, 1), since the electron accumulation states are opposite laterally to that obtained when the data is (1, 0), the magnitudes of the detected drain currents id1, id2 are reversed from those in the data (1, 0). FIG. 8 shows the drain current id1 in the "ON" state obtained when the first source/drain region 23a on the first floating gate 27a side in which the electrons are not accumulated serves as the source.

In case of reading the data (1, 0) and data (0, 1), the pulling-up of the floating gate potential by the above drain voltage Vd and the pulling-down of the floating gate potential by the source voltage Vs make it possible to generate the effect of increasing the so-called "current window". Here, the current window acts as the index of the margin to discriminate the "ON" state and the "OFF" state. In other words, this current window is the difference between the lowest level of the drain current in the "ON" state and the highest level of the drain current in the "OFF" state. More particularly, it is corresponding to the difference between the drain current values obtained when the voltage is applied in different directions between the drain and the source of the memory element, in which "1" is programed onto one floating gate only.

The current window in FIG. 8 is indicated by the difference between the drain current id1 of the "ON" state in the read of data (0, 1) and the drain current id1 of the "off" state in the read of data (1, 0).

Next, in the reading operation of the data (1, 1), since the electrons are accumulated in both the floating gates 27a and 27b, the potentials of the floating gates 27a and 27b are pulled down. And also since the charge accumulation state is bilaterally symmetric, both the drain currents id1, id2 are reduced to the very small value. The id-Vd characteristic of the drain current id1 is shown in FIG. 8.

After this, the first bit and the second bit are read by identifying combinations of the magnitudes of the current values and the directions of the currents as for the drain currents id1, id2 detected as above.

As described above, in the reading operation of the stored data by using the semiconductor memory device of this embodiment, since the reading of the stored data can be carried out based on the wide current window, the four-value states can be read to distinguish clearly.

(iii) Erasing Operation

Next, an operation of erasing the stored data will be explained hereunder.

Figure 9:
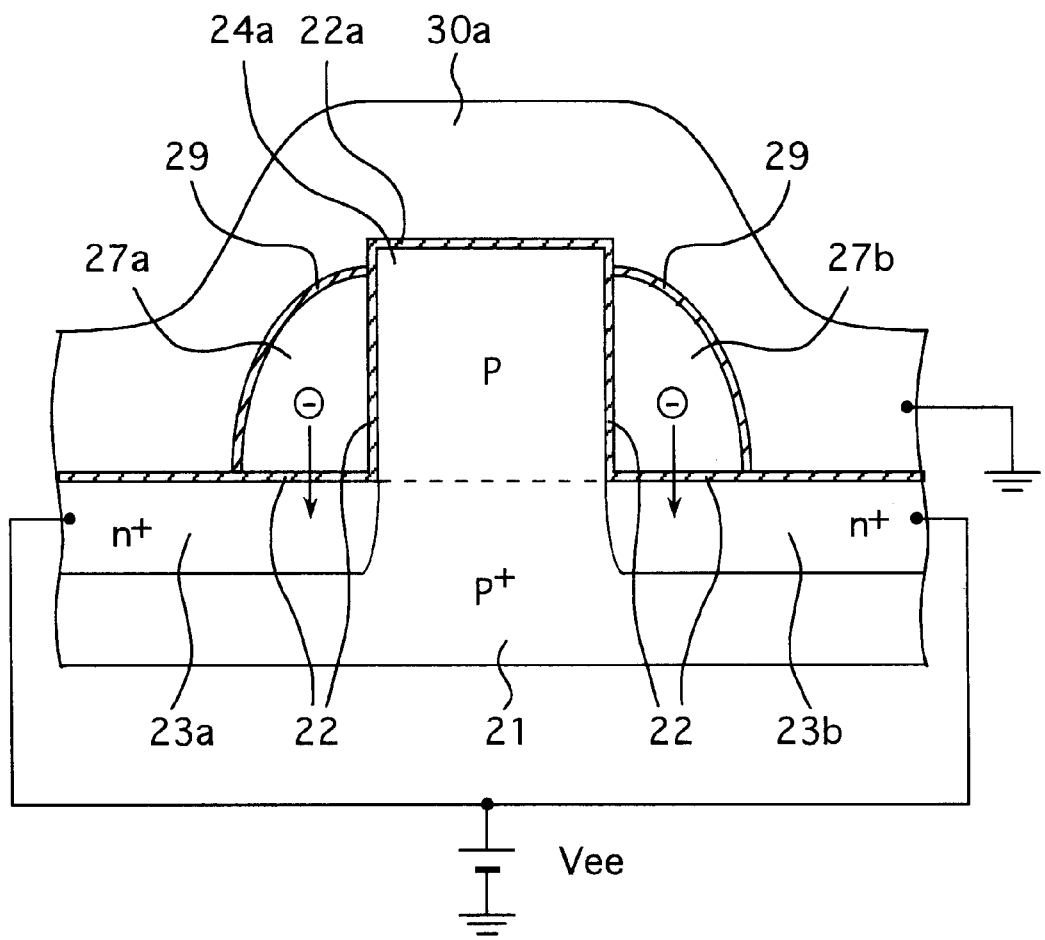
FIG. 9 is a sectional view showing an erasing method of the semiconductor memory device driving method as the embodiment of the present invention.

In order to erase the stored data, as shown in FIG. 9, for example, the control gates 30a, 30b, . . . are set to 0 V and the voltages of both the source and the drain 23a, 23b are increased (e.g., Vee=12 V).

In this case, since the source/drain regions 23a, 23b oppose to the corresponding floating gates 27a, 27b, the electrons accumulated in the floating gates 27a, 27b can be easily exhausted from the source/drain region 23a, 23b by the Fowler-Nordheim current (F-N current) via the silicon oxide films 22 with a small film thickness (e.g., about 5 nm) between the floating gate 27a or 27b and the source/drain region 23a or 23b.

In the normal flash memory, the chip erase is employed as the data erase to increase the voltage of the substrate. In the case of the semiconductor memory device of the present invention, since the data erase can be carried out in the source/drain unit that is selected independently with the substrate, not only the chip erase but also one element unit (block unit) erase can be carried out.

As described above, in the semiconductor memory device driving method as the embodiment of the present invention, two bits per one element are formed by the first and second floating gates 27a, 27b, and also the 4-value states are set by the combinations of the charge accumulation or no charge accumulation into the first floating gate 27a and the charge accumulation or no charge accumulation into the second floating gate 27b, and 4-value states can be read by detecting directions of drain currents and magnitudes of the drain currents.

(3) Semiconductor Memory Device Manufacturing Method

Next, a semiconductor memory device manufacturing method according to a third embodiment of the present invention will be explained with reference to FIG. 10A to FIG. 10P hereunder.

Figure 10A:
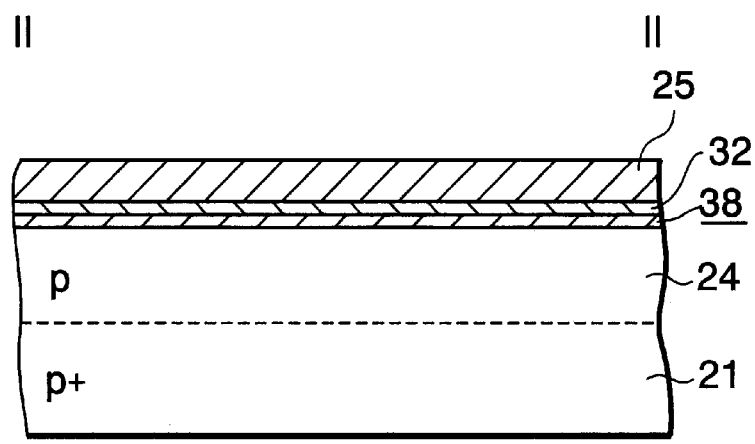
FIG. 10A to FIG. 10P are sectional views showing a semiconductor memory device manufacturing method according to the embodiment of the present invention, wherein FIG. 10A to FIG. 10N correspond to the cross section taken along the II—II line in FIG. 3A, and FIG. 10O and FIG. 10P correspond to a set of the cross sections taken along the II—II line and the III—III line in FIG. 3A.
Figure 10B:
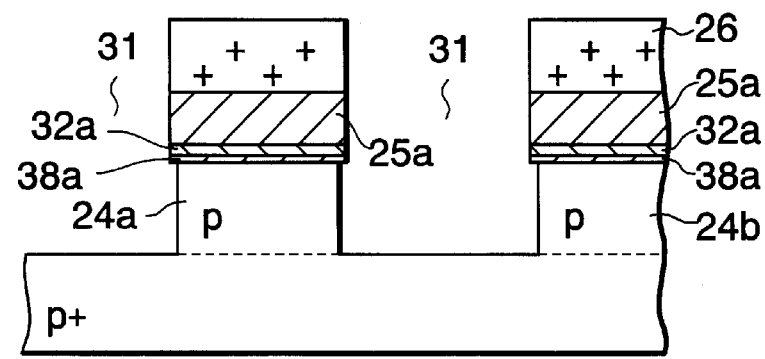
Figure 10C:
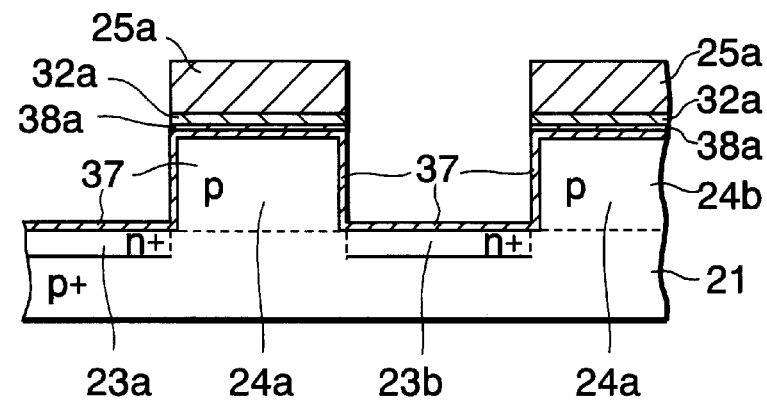
Figure 10D:
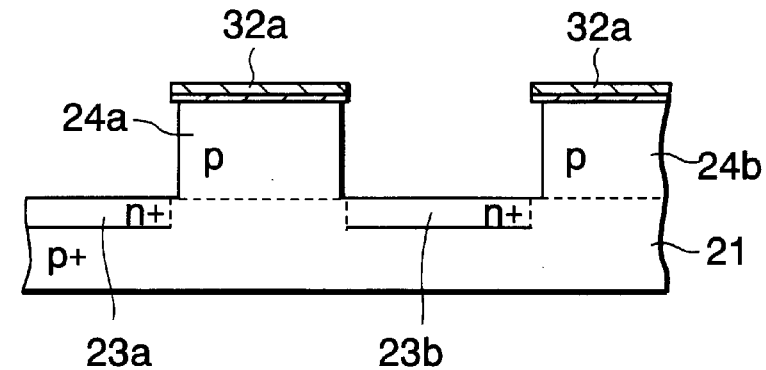
Figure 10E:
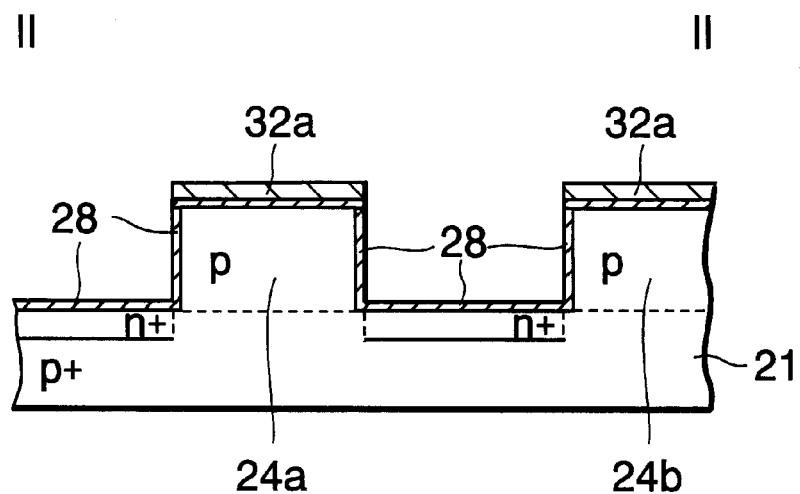
Figure 10F:
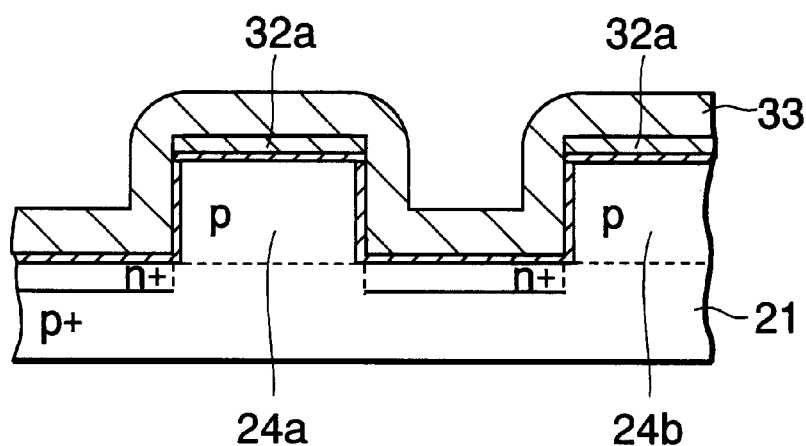
Figure 10G:
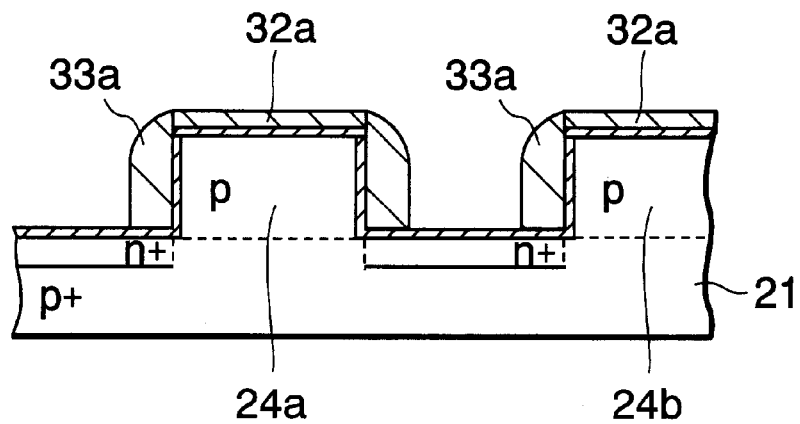
Figure 10H:
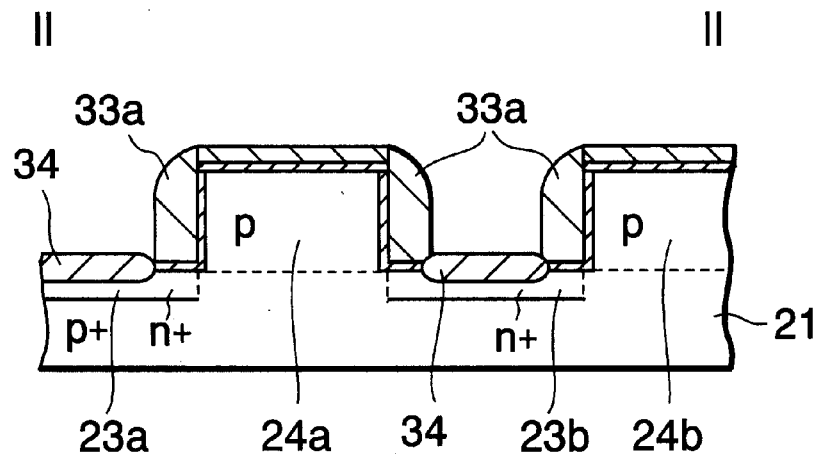
Figure 10:
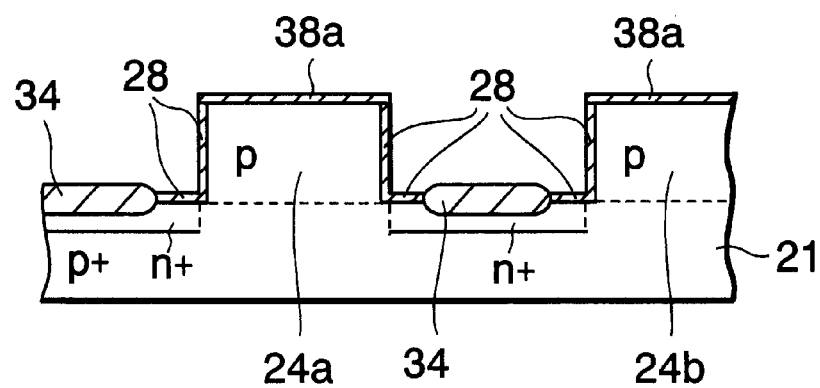
Figure 10J:
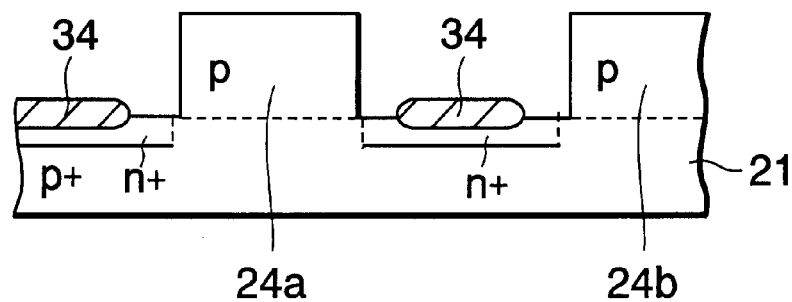
Figure 10K:
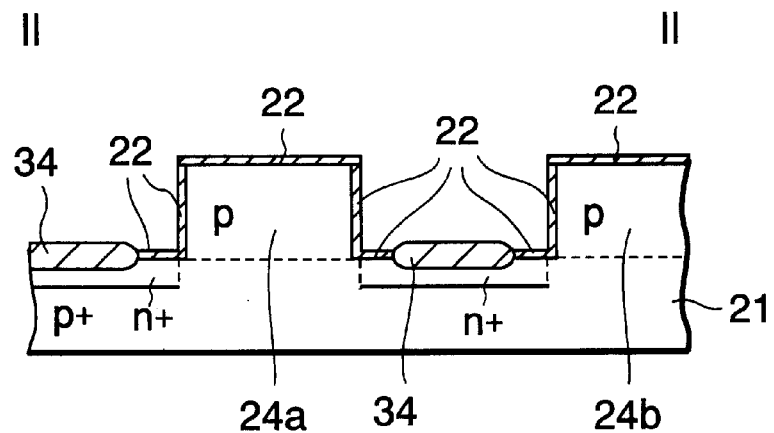
Figure 10L:
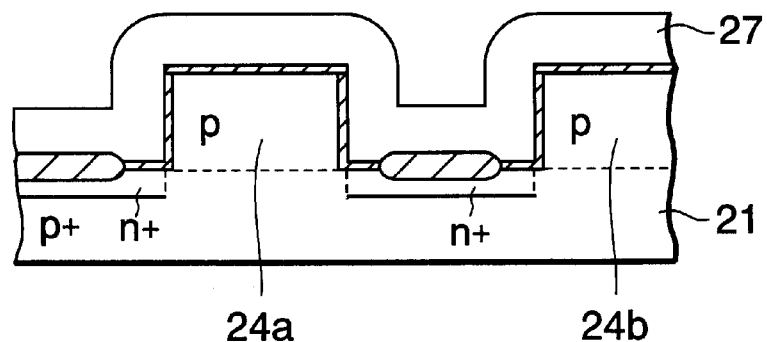
Figure 10M:
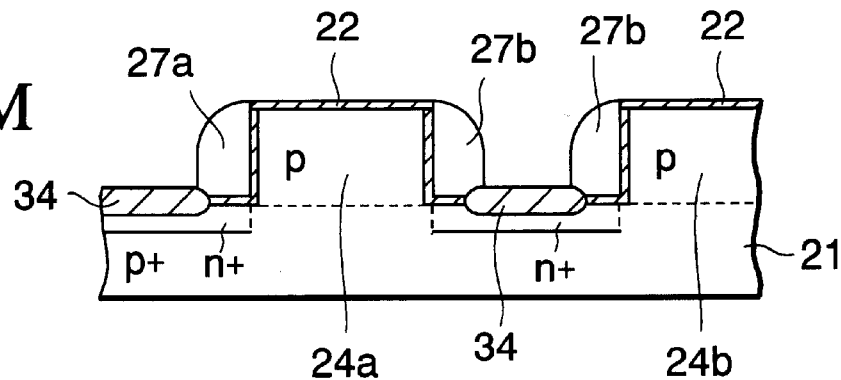
Figure 10N:
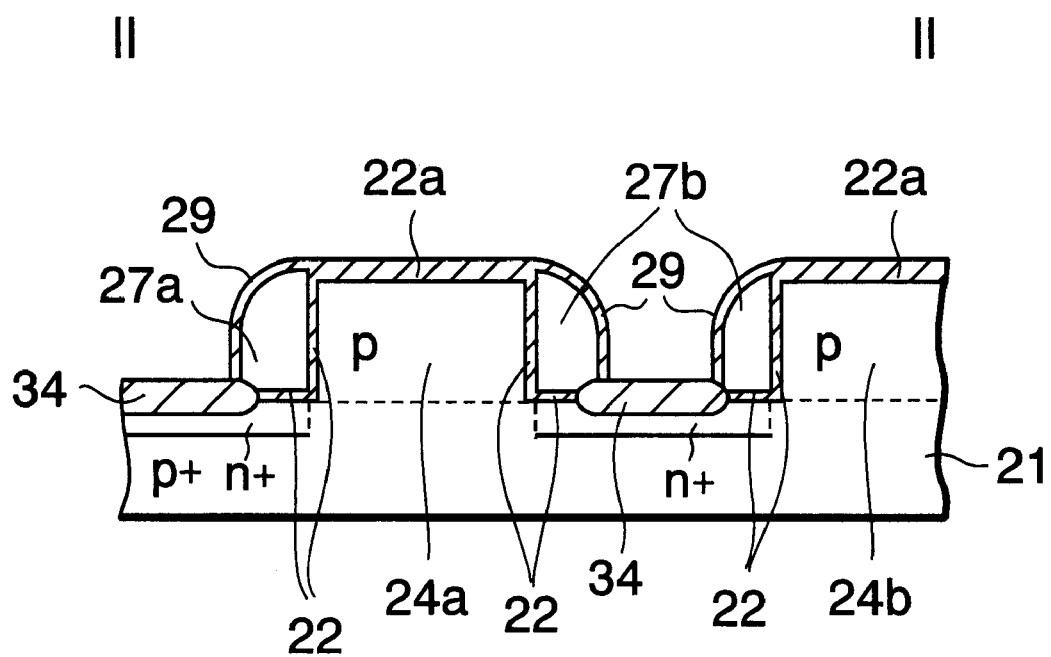
Figure 10:
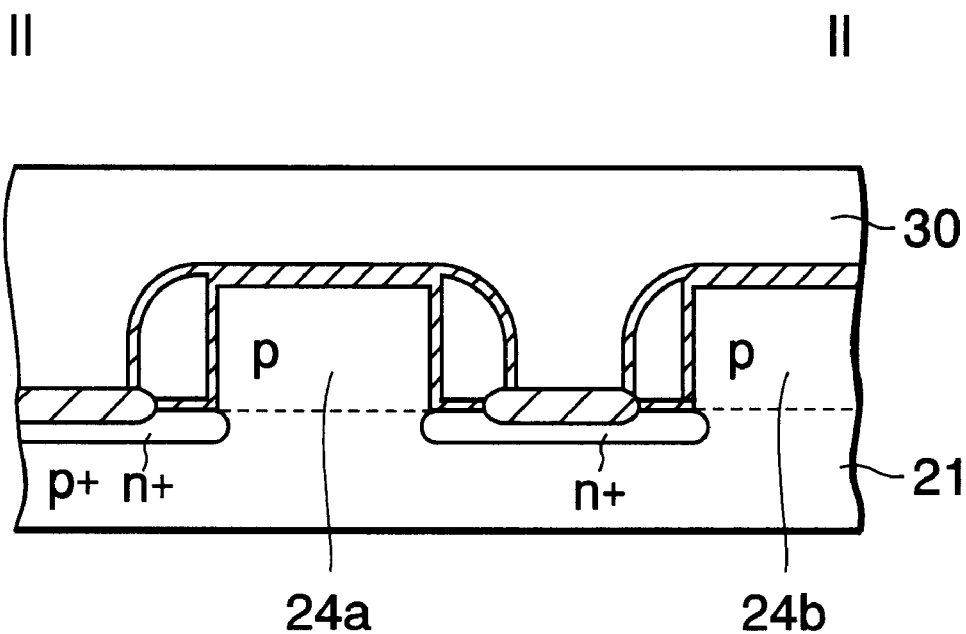
Figure 10:
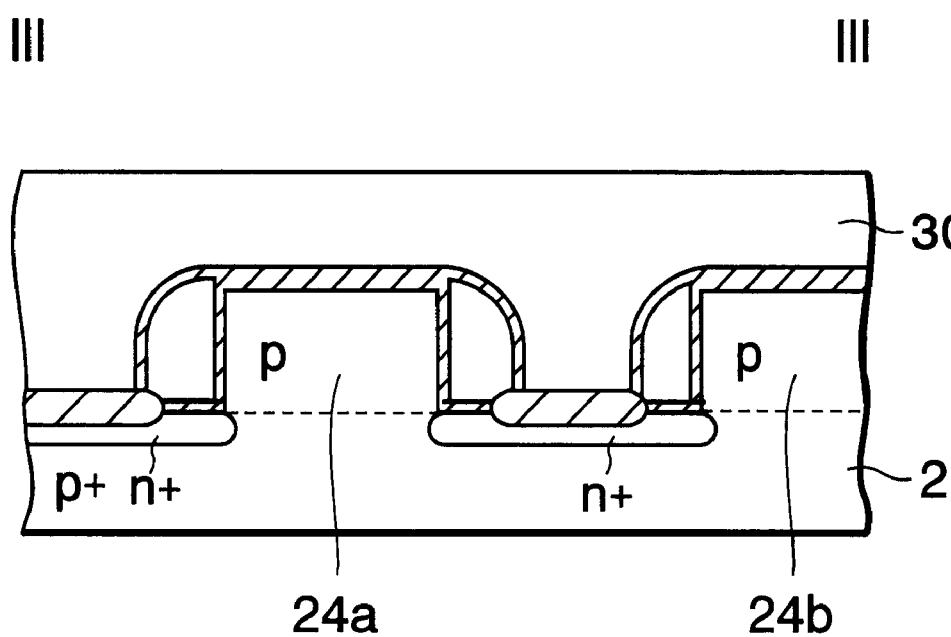
Figure 10:
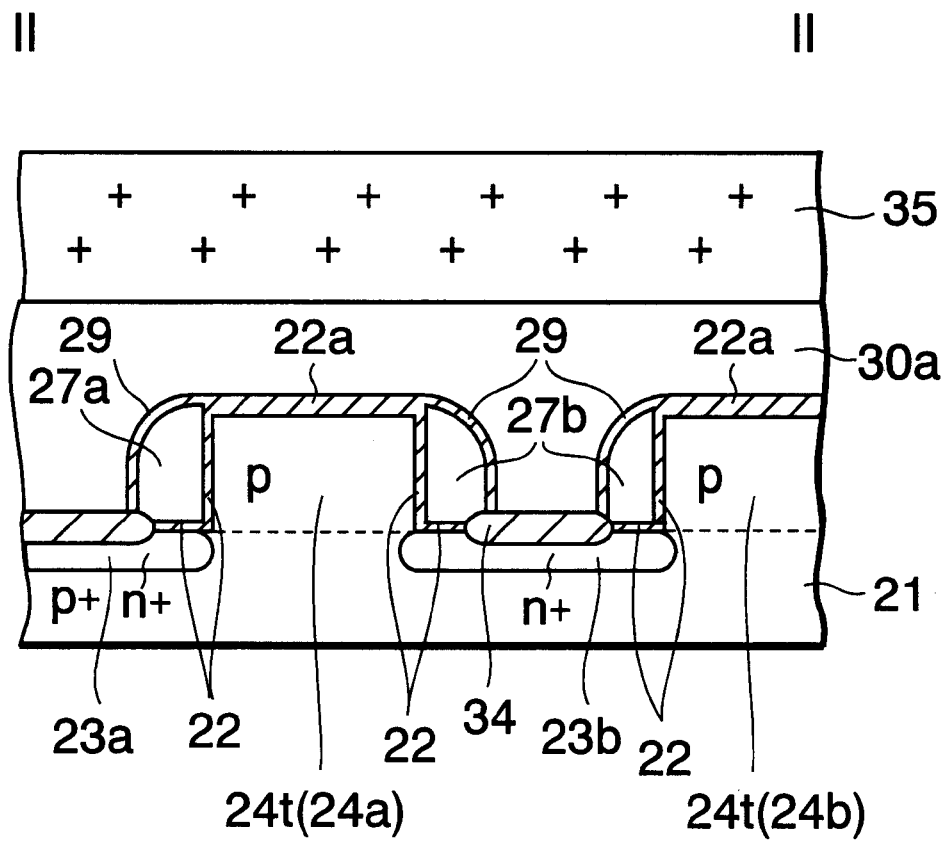
Figure 10:
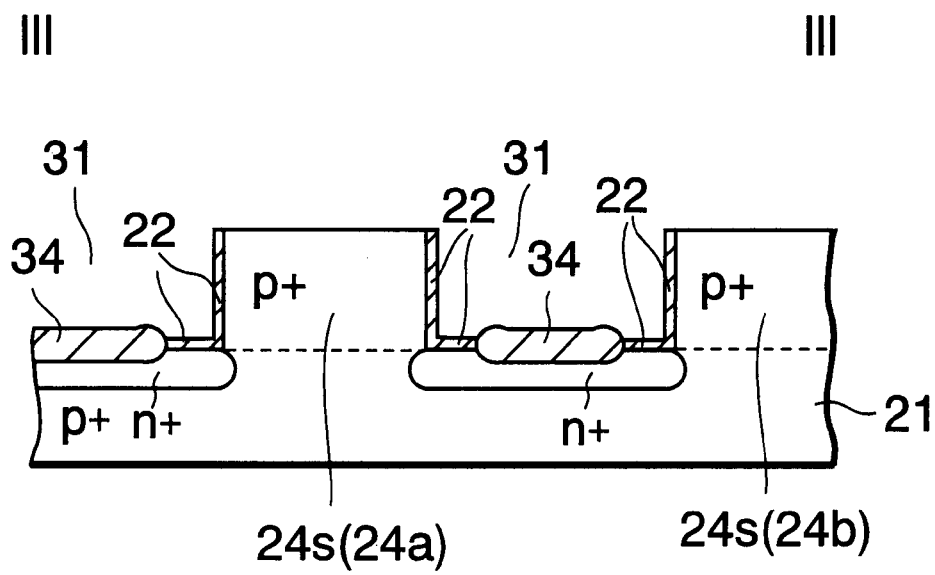

FIG. 10A to FIG. 10N correspond to the cross section taken along the II—II line in FIG. 3A, and FIG. 10O and FIG. 10P correspond to a set of the cross sections taken along the II—II line and the III—III line in FIG. 3A respectively.

Here, the semiconductor memory device in which a plurality of transistors are arranged in rows and columns, is fabricated as follows.

First, as shown in FIG. 10A, the p-type (one conductivity type) silicon layer 24 whose concentration is lower than the silicon base body 21 is formed on the p-type silicon base body 21 by the epitaxial growth, etc.

Then, a silicon oxide film (lower insulating film) 38 of about 10 nm thickness is formed by the thermal oxidation, and then a silicon nitride film (oxidation resistant film) 32 of about 50 nm thickness and a silicon oxide film (upper insulating film) 25 of about 300 nm thickness are formed by the chemical vapor deposition method (CVD method).

Then, as shown in FIG. 10B, a resist film is formed on the silicon oxide film 25, and then stripe-shaped resist masks (etching resistant masks) 26 that are arranged in parallel mutually at a distance in the column direction are formed by patterning the resist film. In turn, the silicon oxide film 25, the silicon nitride film 32 and the silicon oxide film 38 are etched sequentially based on the resist masks 26 and also the silicon layer 24 is etched. As a result, stripe-shaped pattern layers that are arranged in parallel at a distance mutually in the column direction are formed, and also the stripe-shaped convex silicon layers (convex semiconductor layers) 24a, 24b that are arranged in parallel at a distance mutually in the column direction are formed thereunder. The above structure corresponds to the silicon substrate.

The stripe-shaped pattern layers consist of the silicon oxide films 38a, the silicon nitride films 32a, and the silicon oxide films 25a, all being subjected to the patterning. The uppermost stripe-shaped silicon oxide films 25a are employed as the ion implantation mask. In FIG. 10B, references 31 denote concave portions formed after the silicon oxide film 25, the silicon nitride film 32, the silicon oxide film 38, and the convex silicon layer 24 are etched.

Then, the resist masks 26 are removed. Then, as shown in FIG. 10C, a silicon oxide film (insulating film) 37 acting as the ion implantation mask and having a film thickness of 20 to 30 nm is formed on both sides of the convex silicon layers 24a, 24b by the thermal oxidation. At this time, similarly the silicon oxide film (insulating film) 37 of 20 to 30 nm thickness is formed on the surface of the silicon base body 21 exposed between the neighboring convex silicon layers 24a, 24b.

Then, as shown in FIG. 10C, while using the silicon oxide films 25a and 37 on upper surfaces and side surfaces of the convex silicon layers 24a, 24b as a mask, the n-type (opposite conductivity type) impurity is ion-implanted through the silicon oxide film 37 on the surface of the silicon base body 21. At this time, the ion injection conditions that render the ions to penetrate the silicon oxide film 37 on the surface of the silicon base body 21 must be set. On the other hand, since the ion implant direction is substantially perpendicular to the surface of the silicon base body 21, the ions do not penetrate the silicon oxide film 37 on the side surfaces of the convex silicon layers 24a, 24b. As a result, the first n-type (opposite conductivity type) region (first source/drain region) 23a and the second n-type region (second source/drain region) 23b, both formed at high concentration and in the stripe-shaped regions that are on the surface of the silicon base body 21 and extend along the column direction to put the convex silicon layers 24a, 24b between them, are formed.

Then, as shown in FIG. 10D, remaining silicon oxide films 25a and 37 are removed. Then, as shown in FIG. 10E, while using the silicon nitride films 32a of the stripe-shaped pattern layers as a mask, the silicon oxide films (insulating films) 28 of about 10 nm thickness are formed on the side surfaces of the convex silicon layers 24a, 24b and the surface of the silicon base body 21 exposed between the neighboring convex silicon layers 24a, 24b by the thermal oxidation.

Then, as shown in FIG. 10F, the silicon nitride film (oxidation resistant film) 33 of about 130 nm thickness is formed on the entire surface by the CVD method. Then, as shown in FIG. 10G, sidewall insulating films 33a are formed on the side surfaces of the convex silicon layers 24a, 24b by anisotropic-etching the silicon nitride film 33. At this time, the silicon nitride films 32a formed originally over the upper surfaces of the convex silicon layers 24a, 24b may be etched slightly in the etching of the silicon nitride film 33, but most of them still remains.

Then, as shown in FIG. 10H, while using the sidewall insulating films 33a and the silicon nitride films 32a over the upper surfaces of the convex silicon layers 24a, 24b as a mask, the silicon base body 21 between the convex silicon layers 24a, 24b is thermally oxidized selectively. Accordingly, the stripe-shaped silicon oxide films (thick insulating films) 34 that have a film thickness of about 50 nm and extend on the middle areas of the stripe-shaped first and second n-type regions 23a, 23b along the column direction are formed.

Then, as shown in FIG. 10I, the sidewall insulating films 33a and the silicon nitride films 32a over the upper surfaces of the convex silicon layers 24a, 24b are removed. In turn, as shown in FIG. 10J, the silicon oxide films 38a, 28 on the upper surfaces and the side surfaces of the convex silicon layers 24a, 24b and on the surface of the silicon base body 21 are removed. At this time, since the film thicknesses of the thick silicon oxide films 34 are formed thicker than those of the silicon oxide films 38a, 28, the thick silicon oxide films 34 are not removed and the most part of them still remains.

Then, as shown in FIG. 10K, a new silicon oxide film (first insulating film) 22 acting as the gate insulating film is formed on the upper surfaces and the side surfaces of the exposed convex silicon layers 24a, 24b and on the surface of the silicon base body 21 by the thermal oxidation. Then, as shown in FIG. 10L, a polysilicon film (first conductive film) 27 of about 130 nm thickness is formed on the overall surface by the CVD method.

Then, as shown in FIG. 10M, conductive sidewalls (first and second conductive sidewalls) 27a, 27b made of polysilicon films continuously extending in the column direction are formed on the side surfaces of the stripe-shaped convex silicon layers 24a, 24b via the silicon oxide film 22 by etching the polysilicon film 27 by virtue of anisotropic-etching.

The film thickness of the silicon nitride film 33 constituting the sidewall insulating films 33a used in the selective oxidation method is set substantially equal to that of the polysilicon film 27 constituting the conductive sidewalls 27a, 27b. Therefore, the first conductive sidewall 27a can be formed on the first n-type region 23a to extend from the side surface of the convex silicon layer 24a on the first n-type region 23a side to end portion of the thick insulating film 34, whereas the second conductive sidewall 27b can be formed on the second n-type region 23b to extend from the side surface of the convex silicon layer 24a on the second n-type region 23b side to end portion of the thick insulating film 34. Similarly, the first conductive sidewall 27a extending to the end portion of the thick insulating film 34 and the second conductive sidewall 27b extending to the end portion of the thick insulating film 34 are formed on the side surface of the convex silicon layer 24b.

Then, as shown in FIG. 10N, the silicon oxide films (second insulating films) 29 of about 8 nm thickness are formed on the surfaces of the conductive sidewalls 27a, 27b made of the polysilicon film by the thermal oxidation. The silicon oxide films 29 on the surfaces of the conductive sidewalls 27a, 27b must be formed thinner than the thick silicon oxide films 34.

Then, as shown in FIG. 10O, the conductivity impurities in the source/drain regions 23a, 23b are activated and diffused into the peripheral portions by the annealing process. Then, the polysilicon film (second conductive film) 30 of about 250 nm thickness is formed on the overall surface by the CVD method, for example.

Then, as shown in FIG. 10P, a plurality of stripe-shaped resist masks (etching resistant masks) 35 are formed in parallel at a distance mutually in the row direction by the photolithography technology. Then, the polysilicon film 30 is etched based on the resist masks 35. Thus, a plurality of stripe-shaped control gates 30a, 30b which intersect with the stripe-shaped convex silicon layers 24a, 24b are formed. As the etching conditions, for example, the mixed gas containing $Cl_2+O_2$ is employed, and the gas type and the gas flow rate are selected such that the selective etching ratio of the polysilicon to the silicon oxide film is in excess of 30.

In addition, the p-type impurity is introduced into the convex silicon layers 24a, 24b based on the above resist masks 35 by the ion implantation. Therefore, the convex silicon layers 24a, 24b existing between the control gates 30a, 30b are formed as the p-type high-concentration impurity layer. As shown in FIG. 2, the convex silicon layers 24a, 24b under the control gate 30a serve as operation layers 24t that have the low concentration p-type impurity, while the convex silicon layers 24a, 24b not covered with the resist masks 35 serve as element isolation layers 24s that have the higher concentration p-type impurity than the operation layers 24t. The channel regions of the semiconductor memory elements Tr are formed in respective operation layers 24t.

In turn, as shown in the lower drawing of FIG. 10P, the silicon oxide films 29 on the conductive sidewalls 27a, 27b, which are not covered with the resist masks 35, are removed by the etching based on the resist masks 35. As the etching conditions, for example, the mixed gas containing $C_4F_8+CH_2F_2+Ar$ is employed, and the gas type and the gas flow rate are selected such that the selective etching ratio of the silicon oxide film to the silicon is in excess of 30. In this case, the insulating films 34 whose thickness is thicker than the thicknesses of the silicon oxide films 29 on the surfaces of the conductive sidewalls 27a, 27b still remain in the thick insulating film regions on the silicon base body 21 located between neighboring convex silicon layers 24a, 24b and between the opposing conductive sidewalls 27a, 27b. For this reason, it is possible to prevent the exposure of the silicon base body 21 located between neighboring convex silicon layers 24a, 24b and between the opposing conductive sidewalls 27a, 27b when the silicon oxide films 29 on the surfaces of the conductive sidewalls 27a, 27b between the neighboring control gates 30a, 30b are removed.

Then, as shown in the lower drawing of FIG. 10P, the conductive sidewalls 27a, 27b, that are not covered with the control gates 30a and are exposed, are removed by the etching based on the same resist masks 35. As the etching conditions, for example, the mixed gas containing $Cl_2+O_2$ is employed, and the gas type and the gas flow rate are selected such that the selective etching ratio of the polysilicon to the silicon oxide film is more than 30. As a result, as shown in FIG. 2, the first and second floating gates 27a, 27b of the semiconductor memory elements Tr are formed under the control gates 30a, 30b, and also the floating gates 27a, 27b are separated between the semiconductor memory elements Tr.

At this time, the convex silicon layers 24a, 24b exposed between the neighboring control gates 30a, 30b are also etched. However, since the etching rate of the convex silicon layers 24a, 24b formed of single-crystal silicon is slow rather than the floating gates 27a, 27b formed of polysilicon, an amount of etching of the convex silicon layers 24a, 24b is very small even when all the floating gates 27a, 27b are removed, and thus most of the convex silicon layers 24a, 24b still remains. Further, since the silicon base body 21 in the area between the neighboring control gates is covered with the silicon oxide films 34, such silicon base body 21 is not etched.

After this, the silicon oxide film 36 is formed on the entire surface, whereby the semiconductor memory device is completed via the normal steps. FIG. 3B is a sectional view of the semiconductor memory device.

With the above, the semiconductor memory device manufacturing method is explained by limiting the present invention into the sectional range taken along the II—II line and III—III line in FIG. 3A, but it is needless to say that the present invention may be applied to the full range in which the semiconductor memory device can be formed.

As described above, in the semiconductor memory device manufacturing method as the embodiment of the present invention, when the conductive sidewalls 27a, 27b between the neighboring control gates 30a, 30b are separated, the silicon base body 21 between the conductive sidewalls 27a, 27b can be prevented by the thick silicon oxide films 34 from being etched. As a result, unevenness of the surface is reduced. Accordingly, it is possible to suppress the possibility that so-called film disconnection, etc. occurs when the film is formed thereon, etc., the possibility that the defects are introduced by etching the silicon base body 21, etc.

In the above second embodiment, in the step in FIG. 10N, the silicon oxide films 29 formed by the thermal oxidation are employed as the insulating film for covering the conductive sidewalls 27a, 27b. A triple-layered insulating film as the so-called ONO film, which is obtained by laminating sequentially the silicon oxide film, the silicon nitride film, and the silicon oxide film may be employed. In this case, a total film thickness of the triple-layered insulating film may be set appropriately smaller than the film thicknesses of the thick insulating films 34, and also may be set substantially identically to the film thicknesses of the single-layered silicon oxide films 29. The triple-layered insulating film obtained as the ONO film can be formed on the conductive sidewalls 27a, 27b by forming the lowest silicon oxide film of the triple-layered insulating film on partial areas by the thermal oxidizing method and then forming upper two insulating films on the overall surface by the CVD method. Because at least two layers of the triple-layered insulating film as the ONO film are formed on the overall surface, the film thickness of the insulating film interposed between the convex silicon layers 24a, 24b and the control gates 30a, 30b is increased, but no problem has come up.

Also, in the steps in FIG. 10P, when the conductive side walls 27a, 27b between the neighboring control gates 30a, 30b are removed, the convex silicon layer 24a, 24b are almost remained. However, the convex silicon layer 24a, 24b between the neighboring control gates 30a, 30b may be removed by excessive etching to separate the convex silicon layer 24a, 24b in addition to the floating gates 27a, 27b.

In this case, a plurality of island-like convex silicon layers 24t that are separated mutually are arranged regularly in rows and columns. The silicon oxide films 22 formed on the side surfaces of the convex silicon layers 24a, 24b are left after the convex silicon layers 24a, 24b are removed, but such silicon oxide films 22 may be removed by the slight etching. The semiconductor memory device fabricated in this manner are shown in FIG. 11A of plan view and FIG. 11B of sectional view taken along IV—IV line of FIG. 11A. In FIG. 11A and FIG. 11B, since the same references as those in FIG. 3A and FIG. 3B denote the same constituent elements as those in FIG. 3A and FIG. 3B, their explanations will be omitted.

As described above, the present invention is explained in detail with reference to the embodiments, but the scope of the present invention is not limited to the examples shown particularly in the above embodiments. Variations of the above embodiments not to depart from the gist of the present invention may be contained in the scope of the present invention.

For example, in the above embodiments, the polysilicon is employed as the material of the floating gates 27a, 27b and the control gates 30a, 30b, . . . But other conductive material may be employed.

Figure 12:
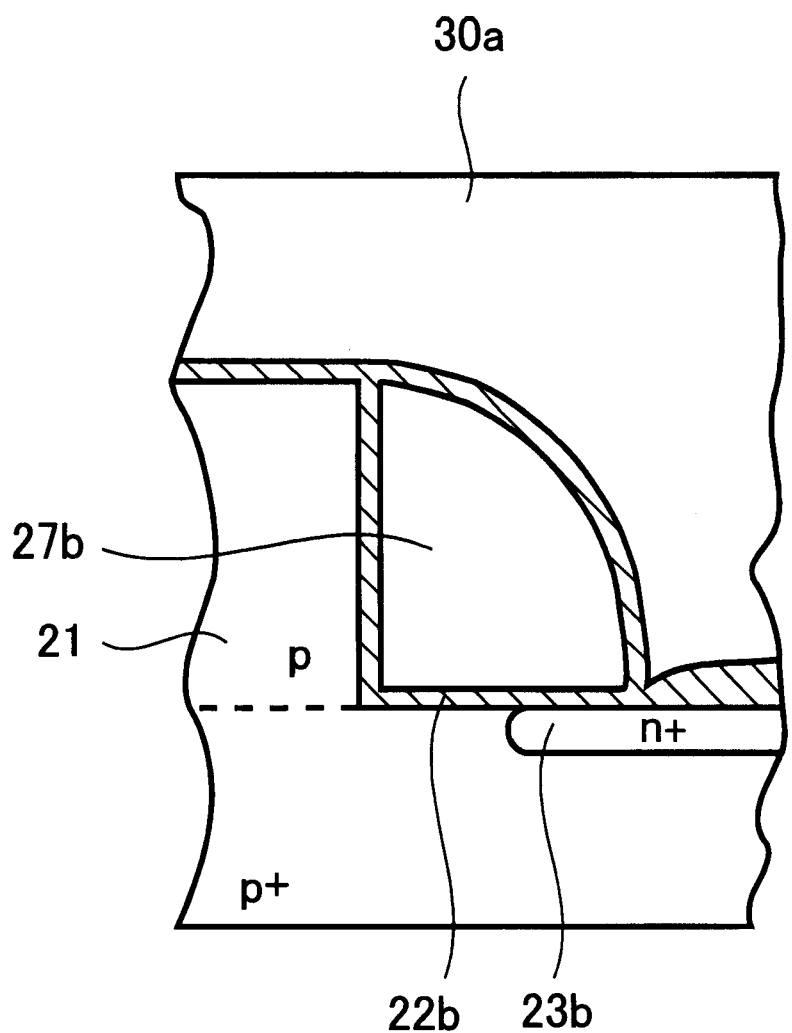
FIG. 12 is a sectional view showing other configuration of the semiconductor memory device according to the embodiment of the present invention.

Also, in the above embodiments, as shown in FIG. 3A, the overall bottom surfaces of the floating gates 27a, 27b are arranged on the corresponding source/drain regions 23a, 23b respectively. But the case where a part of the bottom surfaces of the floating gates 27a, 27b are arranged on the source/drain regions 23a, 23b respectively may be contained as shown in FIG. 12 in which only the floating gate 27b on the source/drain region 23b is shown.

What is claimed is:

1. A semiconductor memory device containing a semiconductor memory element, the element comprising:
    a one conductivity type semiconductor substrate in which a convex portion having a pair of opposing side surfaces is provided;
    a pair of opposite conductivity type source/drain regions formed on a surface of the semiconductor substrate on both sides of the convex portion;
    a first insulating film for covering upper surface of the convex portion;
    second insulating films for covering the side surfaces of the convex portion and the source/drain regions;
    a pair of floating gates provided on the side surfaces of the convex portion to oppose to the side surfaces and the source/drain regions via the second insulating films respectively;
    third insulating films formed on the floating gates; and
    control gate opposing to the upper surface of the convex portion via the first insulating film and opposing to the floating gates via the third insulating films respectively.

2. A semiconductor memory device according to claim 1, wherein a surface region of the convex portion being arranged between the pair of source/drain regions and extending from one side surface of the convex portion to other side surface via an upper surface acts as a channel region, and the pair of floating gates act as charge accumulating regions for accumulating charges, and
    two bits are formed per one element by the pair of floating gates, and 4-value states are formed by combinations of a charge accumulation or no charge accumulation into respective floating gates.

3. A semiconductor memory device according to claim 1, wherein the convex portion is formed by a semiconductor layer on the semiconductor substrate.

4. A semiconductor memory device according to claim 1, wherein semiconductor memory elements are arranged in plural in columns and rows.

5. A semiconductor memory device comprising:
    a one conductivity type semiconductor substrate on which a plurality of stripe-shaped convex portions each having a pair of opposing side surfaces are provided at a distance in a column direction;
    a pair of opposite conductivity type source/drain regions formed on a surface of the semiconductor substrate on both sides of the stripe-shaped convex portions;
    first insulating films for covering upper surfaces of the stripe-shaped convex portions;
    second insulating films for covering the side surfaces of respective stripe-shaped convex portions and the source/drain regions;
    plural pairs of floating gates opposed to the side surfaces of the stripe-shaped convex portions and the source/drain regions via the second insulating films and arranged at a distance along the side surfaces of the stripe-shaped convex portions;
    third insulating films formed on the floating gates; and
    a plurality of control gates opposed to the upper surfaces of the stripe-shaped convex portions via the first insulating films and opposed to the plural pairs of the floating gates via the third insulating films, and provided at a distance in a row direction;
    wherein semiconductor memory elements are formed at intersecting regions of the control gates and the stripe-shaped convex portions.

6. A semiconductor memory device according to claim 5, wherein the stripe-shaped convex portions are formed by a semiconductor layer on the semiconductor substrate.

7. A semiconductor memory device according to claim 5, wherein the memory elements in neighboring stripe-shaped convex portions share the source/drain region that is put between the neighboring stripe-shaped convex portions.

8. A semiconductor memory device according to claim 5, wherein a portion that is put between the semiconductor memory elements in the stripe-shaped convex portions of one column acts as an element isolation layer whose one conductivity impurity concentration is higher than portions on which the semiconductor memory elements are formed.

9. A semiconductor memory device according to claim 5, wherein the control gate and the source/drain region are opposed to each other via an insulating film in an area between the floating gates located in concave region between neighboring stripe-shaped convex portions, and the insulating film in the opposing area has a film thickness which is thicker than the insulating film under the floating gates.

10. A semiconductor memory device manufacturing method comprising the steps of:
   forming a convex portion having a pair of opposing side surfaces by etching selectively a semiconductor substrate based on a mask on the semiconductor substrate;
   introducing based on the mask an opposite conductivity type impurity into a surface area of the semiconductor substrate on both sides of the convex portion such that opposite conductivity type source/drain regions are formed on both sides of the convex portion respectively to put the convex portion therebetween;
   forming an insulating film on upper surface and both side surfaces of the convex portion and surfaces of the source/drain regions;
   forming a first conductive film on an overall surface;
   forming a pair of floating gates that oppose to side surfaces of the convex portion and the source/drain regions via the insulating film by anisotropic-etching the first conductive film;
   forming insulating films on surfaces of the floating gates;
   forming a second conductive film on an overall surface; and
   forming control gate, which oppose to upper surface of the convex portion via the insulating film on the upper surface of the convex portion and also oppose to the floating gates via the insulating films on the surfaces of the floating gates, by patterning the second conductive film.

11. A semiconductor memory device manufacturing method of manufacturing a semiconductor memory device in which a plurality of semiconductor memory elements are arranged in rows and columns on a semiconductor substrate, the method comprising the steps of:
   (i) forming a plurality of stripe-shaped pattern layers each containing an oxidation resistant film in a column direction at a distance on one conductivity type semiconductor substrate;
   (ii) forming a plurality of stripe-shaped convex portions each having a pair of opposing side surfaces, by etching the semiconductor substrate exposed from both sides of the stripe-shaped pattern layers;
   (iii) forming opposite conductivity type source/drain regions on a surface layer of the semiconductor substrate on both sides of the stripe-shaped convex portions by ion implantation;
   (iv) exposing oxidation resistant films of the stripe-shaped pattern layers;
   (v) forming a new oxidation resistant film on an overall surface;
   (vi) forming a sidewall insulating film made of the new oxidation resistant film on two side surfaces of the stripe-shaped convex portions by anisotropic-etching the new oxidation resistant film respectively;
   (vii) forming thick insulating films on the source/drain regions between sidewall insulating films by selectively oxidizing surfaces of the source/drain regions using the sidewall insulating films and the oxidation resistant films of the stripe-shaped pattern layers as a mask;
   (viii) exposing surfaces of the stripe-shaped convex portions and the semiconductor substrate while leaving the thick insulating film, and then forming an insulating film on exposed surfaces;
   (ix) forming a first conductive film on an overall surface;
   (x) forming first and second conductive sidewalls on side surfaces of the stripe-shaped convex portions via the insulating films to overlap with end portions of the thick insulating films respectively by anisotropic-etching the first conductive film;
   (xi) forming insulating films, whose film thickness is thinner than a film thickness of the thick insulating film, on surfaces of the first and second conductive sidewalls;
   (xii) forming a second conductive film on an overall surface;
   (xiii) forming a plurality of stripe-shaped control gates in a row direction at a distance by patterning the second conductive film; and
   (xiv) removing sequentially the insulating films and the first and second conductive sidewalls in regions between neighboring control gates to execute an element isolation, and forming first and second floating gates on side surfaces of the stripe-shaped convex portions under the control gates respectively.

12. A semiconductor memory device manufacturing method according to claim 11, wherein each of the stripe-shaped pattern layers consists of a lower insulating film, the oxidation resistant film, and an upper insulating film.

13. A semiconductor memory device manufacturing method according to claim 11, further comprising:
   forming an insulating film on side surfaces of the stripe-shaped convex portions and surfaces of the semiconductor substrate on both sides of the stripe-shaped convex portions before the step of (iii).

14. A semiconductor memory device manufacturing method according to claim 11, wherein the insulating film formed on surfaces of the first and second conductive sidewalls in the step of (xi) consists of any one of triple-layered insulating film obtained by laminating an oxide film, a nitride film, and an oxide film, and a single-layer oxide film.

15. A semiconductor memory device manufacturing method according to claim 11, further comprising:
   forming element isolation layers, that contain one conductivity type impurity at a higher concentration than the stripe-shaped convex portions under the control gates, by introducing one conductivity type impurity into the stripe-shaped convex portions in regions between neighboring control gates after the step of (xiv).

16. A semiconductor memory device driving method of driving a semiconductor memory device containing a semiconductor memory element which comprises a one conductivity type semiconductor substrate on which a convex portion having a pair of opposing side surfaces is provided, a pair of opposite conductivity type source/drain regions formed on a surface of the semiconductor substrate on both sides of the convex portion, a first insulating film for covering an upper surface of the convex portion, second insulating films for covering the side surfaces of the convex portion and the source/drain regions, a pair of floating gates provided on the side surfaces of the convex portion respectively to oppose to the side surfaces and the source/drain regions via the second insulating film respectively, third insulating films formed on the floating gates, and control gates provided to oppose to the upper surface of the convex portion via the first insulating film and oppose to the floating gates via the third insulating film respectively, and the semiconductor memory element in which a surface region of the convex portion, which is arranged between the source/drain regions and extends from one side surface of the convex portion to other side surface via an upper surface, acts as a channel region, the method comprising the steps of:

generating high energy charges in the channel by applying a voltage to the source/drain region as a drain and the control gate; and injecting the charges into the floating gate on the drain side via the second insulating film to accumulate the charges therein so as to control a threshold voltage of the semiconductor memory element.

17. A semiconductor memory device driving method according to claim 16, further comprising the steps of detecting a drain current flowing between one source/drain region as a source and other source/drain region as a drain, and then detecting a drain current flowing between one source/drain region as the drain and other source/drain region as the source, after accumulating the charges in the floating gate on the drain side so as to control a threshold voltage of the semiconductor memory element.

18. A semiconductor memory device driving method according to claim 17, further comprising the step of exhausting the charges accumulated in the floating gate into the source/drain region on the charges-accumulated floating gate side by applying an erase voltage to the source/drain region on the charges-accumulated floating gate side with respect to the control gate, after detecting the drain currents.

19. A semiconductor memory device driving method of driving a semiconductor memory device containing a semiconductor memory element which comprises a one conductivity type semiconductor substrate on which a convex portion having a pair of opposing side surfaces is provided, a pair of opposite conductivity type source/drain regions formed on a surface of the semiconductor substrate on both sides of the convex portion, a first insulating film for covering an upper surface of the convex portion, second insulating films for covering the side surfaces of the convex portion and the source/drain regions, a pair of floating gates provided on the side surfaces of the convex portion respectively to oppose to the side surfaces and the source/drain regions via the second insulating film respectively, third insulating films formed on the floating gates, and control gates provided to oppose to the upper surface of the convex portion via the first insulating film and oppose to the floating gates via the third insulating film respectively, and the semiconductor memory element in which a surface region of the convex portion, which is arranged between the source/drain regions and extends from one side surface of the convex portion to other side surface via an upper surface, acts as a channel region, the method comprising the steps of:

programming the first bit consisting of any one of the first binary value and the second binary value, wherein the first binary value is a state that charges are injected and accumulated in a one floating gate by applying a program voltage to the control gate and a one source/drain region and the second binary value is a state that the charges are not accumulated in the one floating gate;

programming the second bit consisting of any one of the third binary value and the fourth binary value, wherein the third binary value is a state that the charges are injected and accumulated in an other floating gate by applying the program voltage to the control gate and an other source/drain region and the fourth binary value is a state that the charges are not accumulated in the other floating gate;

reading the first bit consisting of any one of the first binary value corresponding to a first drain current value and the second binary value corresponding to a second drain current value larger than the first drain current value by applying a read voltage to the other source/drain region as a drain with respect to the one source/drain region as a source to detect a drain current flowing through the source and the drain;

reading the second bit consisting of any one of the third binary value corresponding to a third drain current value and the fourth binary value corresponding to a fourth drain current value larger than the third drain current value by applying a read voltage to the one source/drain region as a drain with respect to the other source/drain region as a source to detect a drain current flowing through the source and the drain; and erasing data by applying an erase voltage to at least any one of the source/drain regions and the semiconductor substrate via the control gate to exhaust charges that are accumulated in any one of the floating gates.

\* \* \* \* \*

(12) EX PARTE REEXAMINATION CERTIFICATE (6519th)
United States Patent
Miida

(10) Patent Number: US 6,538,925 C1
(45) Certificate Issued: Nov. 11, 2008

(54) SEMICONDUCTOR MEMORY DEVICE, METHOD OF MANUFACTURING THE SAME AND METHOD OF DRIVING THE SAME

(75) Inventor: Takashi Miida, Kanagawa (JP)

(73) Assignee: Innotech Corporation, Yokohama-shi (JP)

Reexamination Request:
No. 90/007,459, Mar. 11, 2005

Reexamination Certificate for:
Patent No.: 6,538,925
Issued: Mar. 25, 2003
Appl. No.: 09/984,190
Filed: Oct. 29, 2001

(30) Foreign Application Priority Data

| Nov. 9, 2000 | (JP) | 2000-342616 |
| Apr. 12, 2001 | (JP) | 2001-114291 |
| Apr. 20, 2001 | (JP) | 2001-123213 |
| May 12, 2001 | (JP) | 2001-143920 |

(51) Int. Cl.
*H01L 21/70* (2006.01)
*H01L 21/8247* (2006.01)
*H01L 27/115* (2006.01)
*G11C 11/34* (2006.01)

(52) U.S. Cl. .......... 365/185.28; 365/185.05; 257/E27.103; 257/E21.682

(58) Field of Classification Search ............ None
See application file for complete search history.

(56) References Cited

U.S. PATENT DOCUMENTS

| 4,479,203 A | * | 10/1984 | Kuo | 365/185.1 |
| 5,379,255 A | | 1/1995 | Shah | 365/185 |
| 5,508,544 A | | 4/1996 | Shah | 257/316 |
| 5,705,415 A | * | 1/1998 | Orlowski et al. | 438/259 |

* cited by examiner

*Primary Examiner*—Erik Kielin

(57) ABSTRACT

The present invention relates to a dual bit nonvolatile programmable read/write memory containing a semiconductor memory element having one conductivity type semiconductor substrate including at least one convex portion. A pair of opposite conductivity source/drain regions are formed on a surface of the semiconductor substrate an opposing sides of the convex portion, and a first insulating film covers the upper surface of the convex portion. Second insulating films cover the side surfaces of the convex portion and the source/drain regions. A pair of floating gates abut opposing side surfaces of the convex portion and the source/drain regions through the second insulating films. Third insulating films are formed on the floating gates. A control gate covers the upper surface of the convex portion through the first insulating film and the floating gates through the third insulating films.

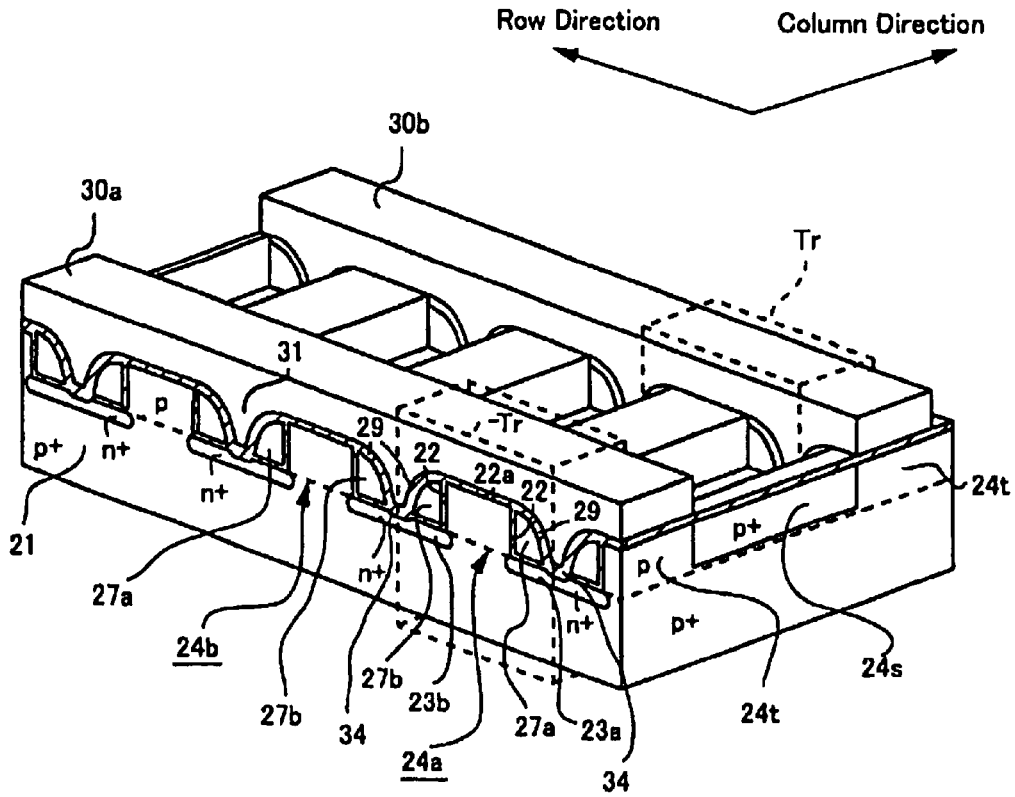

EX PARTE
REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 7, lines 17–19:

A pair of n-type source/drain regions 23a, 23b are formed on the surface of the silicon base body 21 on both sides of the convex silicon layer 24a, *said surface on which the source/drain regions 23a,23b are formed excluding said opposing side surfaces and said upper surface of the convex portion*, as shown in FIGS. 3A and 3B.

AS A RESULT OF REEXAMINATION, IT HAS BEEN DETERMINED THAT:

The patentability of claims 11–15 and 19 is confirmed.

Claims 1, 2, 5, 10 and 16 are determined to be patentable as amended.

Claims 3, 4, 6–9, 17 and 18, dependent on an amended claim, are determined to be patentable.

1. A semiconductor memory device containing a semiconductor memory element, the element comprising:
    a one conductivity type semiconductor substrate in which a convex portion having a pair of opposing side surfaces *and an upper surface* is provided;
    a pair of opposite conductivity type source/drain regions formed on a surface of the semiconductor substrate on both sides of the convex portion, *said surface on which the source/drain regions are formed excluding said opposing side surfaces and said upper surface of the convex portion*;
    a first insulating film for covering *the* upper surface of the convex portion;
    second insulating films for covering the side surfaces of the convex portion and the source/drain regions;
    a pair of floating gates provided on the side surfaces of the convex portion to oppose to the side surfaces and the source/drain regions via the second insulating films respectively;
    third insulating films formed on the floating gates; and
    *a* control gate opposing [to] the upper surface of the convex portion via the first insulating film and opposing [to] the floating gates via the third insulating films respectively; *and wherein a surface region of the convex portion, arranged between the pair of source/drain regions and extending from one side surface to the other side surface via an upper surface acts as a channel region, and the pair of floating gates act as charge accumulating regions for accumulating charges*.
2. A semiconductor memory device according to claim 1, wherein: [a surface region of the convex portion being arranged between the pair of source/drain regions and extending from one side surface of the convex portion to other side surface via an upper surface acts as a channel region, and the pair of floating gates act as charge accumulating regions for accumulating charges, and]:
    two bits are formed per one element by the pair of floating gates, and 4-value states are formed by combinations of a charge accumulation or no charge accumulation into respective floating gates.

5. A semiconductor memory device comprising:
    a one conductivity type semiconductor substrate on which a plurality of stripe-shaped convex portions each having a pair of opposing side surfaces are provided [at a distance] *spaced* in a column direction;
    a pair of opposite conductivity type source/drain regions formed on a surface of the semiconductor substrate on both sides of *each of* the stripe-shaped convex portions;
    first insulating films for covering upper surfaces of the stripe-shaped convex portions, *said surface on which the source/drain regions are formed excluding said opposing side surfaces and said upper surface of the convex portion*;
    second insulating films for covering the side surfaces of respective stripe-shaped convex portions and the source/drain regions;
    plural pairs of floating gates opposed to the side surfaces of the stripe-shaped convex portions and the source/drain regions via the second insulating films and arranged [at a distance] along the side surfaces of the stripe-shaped convex portions;
    third insulating films formed on the floating gates; and
    a plurality of control gates opposed to the upper surfaces of the stripe-shaped convex portions via the first insulating films and opposed to the plural pairs of the floating gates via the third insulating films, and provided [at a distance] *spaced* in a row direction;
    wherein *a surface region of the stripe-shaped convex portion, arranged between the pair of source/drain regions and extending from one side surface of the stripe-shaped convex portion to the other side surface via an upper surface, acts as a channel region, and the pair of floating gates acts as charge accumulating regions for accumulating charges, and* semiconductor memory elements are formed at intersecting regions of the control gates and the stripe-shaped convex portions.

10. A semiconductor memory device manufacturing method comprising the steps of:
    forming a convex portion having a pair of opposing side surfaces [by etching] *using a mask* selectively *etch* a semiconductor substrate [based on a mask] on the semiconductor substrate;
    [introducing based on] *using* the mask *to introduce* an opposite conductivity type impurity into a surface area of the semiconductor substrate on both sides of the convex portion such that opposite conductivity type source/drain regions are formed on both sides of the convex portion respectively to put the convex portion therebetween, *said surface on which the source/drain regions are formed excluding said opposing side surfaces and said upper surface of the convex portion*;
    forming an insulating film on upper surface and both side surfaces of the convex portion and surfaces of the source/drain regions;
    forming a first conductive film on an overall surface;
    forming a pair of floating gates that oppose [to] side surfaces of the convex portion and the source/drain regions via the insulating film by anisotropic-etching the first conductive film;

forming insulating films on surfaces of the floating gates;

forming a second conductive film on an overall surface; and forming *a* control gate, which [oppose] *is opposed* to *an* upper surface of the convex portion via the insulating film on the upper surface of the convex portion and also [oppose] *opposed* to the floating gates via the insulating films on the surfaces of the floating gates, by patterning the second conductive film.

16. A semiconductor memory device driving method of driving a semiconductor memory device containing a semiconductor memory element which comprises a one conductivity type semiconductor substrate on which a convex portion having a pair of opposing side surfaces is provided, a pair of opposite conductivity type source/drain regions formed on a surface of the semiconductor substrate on both sides of the convex portion *such that said surface on which the source/drain regions are formed excludes said opposing side surfaces and said upper surface of the convex portion*, a first insulating film for covering an upper surface of the convex portion, second insulating films for covering the side surfaces of the convex portion and the source/drain regions, a pair of floating gates provided on the side surfaces of the convex portion respectively to oppose [to] the side surfaces and the source/drain regions via the second insulating film respectively, third insulating films formed on the floating gates, and control gates provided to oppose [to] the upper surface of the convex portion via the first insulating film and oppose [to] the floating gates via the third insulating film respectively, and the semiconductor memory element in which a surface region of the convex portion, which is arranged between the source/drain regions and extends from one side surface of the convex portion to *the* other side surface via an upper surface, acts as a channel region, the method comprising the steps of:

generating high energy charges in the channel by applying a voltage to the source/drain region as a drain and the control gate; and injecting the charges into the floating gate on the drain side via the second insulating film to accumulate the charges therein so as to control a threshold voltage of the semiconductor memory element.

\* \* \* \* \*